(12) United States Patent
Iagnemma

(10) Patent No.: US 10,309,792 B2
(45) Date of Patent: Jun. 4, 2019

(54) ROUTE PLANNING FOR AN AUTONOMOUS VEHICLE

(71) Applicant: nuTonomy Inc., Cambridge, MA (US)

(72) Inventor: Karl Iagnemma, Cambridge, MA (US)

(73) Assignee: nuTonomy Inc., Boston, MA (US)

( * ) Notice: Subject to any disclaimer, the term of this patent is extended or adjusted under 35 U.S.C. 154(b) by 0 days.

(21) Appl. No.: 15/182,400

(22) Filed: Jun. 14, 2016

(65) Prior Publication Data

US 2017/0356751 A1    Dec. 14, 2017

(51) Int. Cl.
| | |
|---|---|
| G01C 21/26 | (2006.01) |
| G01C 21/34 | (2006.01) |
| G05D 1/00 | (2006.01) |
| G07C 5/08 | (2006.01) |
| G06F 17/00 | (2006.01) |
| G01C 21/36 | (2006.01) |
| G05D 1/02 | (2006.01) |
| G06F 17/50 | (2006.01) |

(52) U.S. Cl.
CPC ..... *G01C 21/3461* (2013.01); *G01C 21/3691* (2013.01); *G05D 1/0214* (2013.01); *G06F 17/5009* (2013.01); *G07C 5/0808* (2013.01); *G06F 17/5095* (2013.01)

(58) Field of Classification Search
CPC ........ G01C 21/00; G01C 21/26; G01C 21/34; G01C 21/36; G08G 1/00; G08G 1/0104; G08G 1/0125; G08G 1/0129; G08G 1/0133; G06F 17/00; G06F 17/50

See application file for complete search history.

(56) References Cited

U.S. PATENT DOCUMENTS

| | | |
|---|---|---|
| 4,113,046 A | 9/1978 | Arpino |
| 5,128,874 A | 7/1992 | Bhanu et al. |
| 5,166,668 A | 11/1992 | Aoyagi |
| 5,521,579 A | 5/1996 | Bernhard |
| 5,913,917 A | 6/1999 | Murphy |
| 6,018,806 A | 1/2000 | Cortopassi et al. |
| 6,026,347 A | 2/2000 | Schuster |
| 6,067,501 A | 5/2000 | Vieweg |

(Continued)

FOREIGN PATENT DOCUMENTS

| | | |
|---|---|---|
| CN | 105652300 | 6/2016 |
| DE | 102013010983 | 1/2015 |

(Continued)

OTHER PUBLICATIONS

U.S. Appl. No. 15/182,281, filed Jun. 14, 2016—Pending.

(Continued)

*Primary Examiner* — Yonel Beaulieu
(74) *Attorney, Agent, or Firm* — Fish & Richardson P.C.

(57) ABSTRACT

Among other things, a determination is made of and ability of an autonomous vehicle to safely or robustly travel a road feature or a road segment or a route that is being considered for the autonomous vehicle as of a time or range of times. The route conforms to properties of stored road network information. The road feature or road segment or route is eliminated from consideration if the computer has determined that the road feature or road segment or route cannot be safely or robustly traveled by the autonomous vehicle. The determination is based on analysis of performance of the autonomous vehicle.

30 Claims, 9 Drawing Sheets

(56) References Cited

U.S. PATENT DOCUMENTS

Figure 1:
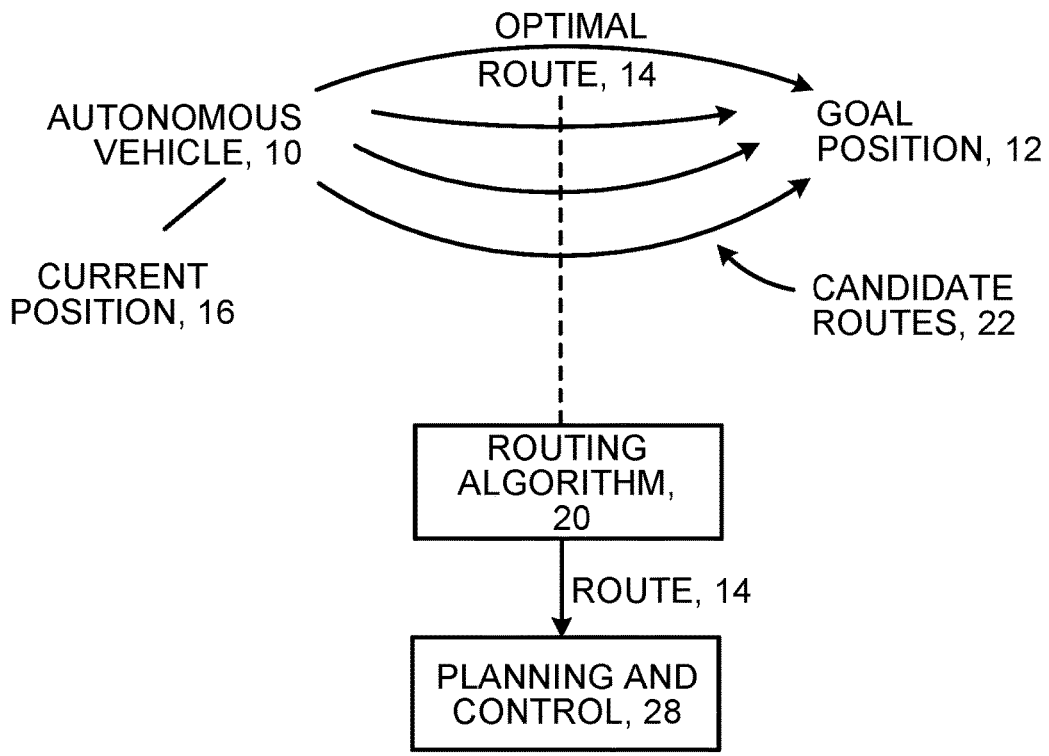

| | | |
|---|---|---|
| 6,126,327 A | 10/2000 | Bi et al. |
| 6,151,539 A | 11/2000 | Bergholz et al. |
| 6,188,602 B1 | 2/2001 | Alexander et al. |
| 6,320,515 B1 | 11/2001 | Olsson |
| 6,356,961 B1 | 3/2002 | Oprescu-Surcobe |
| 6,546,552 B1 | 4/2003 | Peleg |
| 6,768,813 B1 | 7/2004 | Nakayama |
| 6,782,448 B2 | 8/2004 | Goodman et al. |
| 6,836,657 B2 | 12/2004 | Ji et al. |
| 6,947,554 B2 | 9/2005 | Freyman et al. |
| 6,978,198 B2 | 12/2005 | Shi |
| 7,007,049 B2 | 2/2006 | Peng |
| 7,218,212 B2 | 5/2007 | Hu |
| 7,260,465 B2 | 8/2007 | Waldis et al. |
| 7,292,870 B2 | 11/2007 | Heredia et al. |
| 7,350,205 B2 | 3/2008 | Ji |
| 7,512,516 B1 | 3/2009 | Widmann |
| 7,512,673 B2 | 3/2009 | Miloushev et al. |
| 7,516,450 B2 | 4/2009 | Ogura |
| 7,562,360 B2 | 7/2009 | Tai et al. |
| 7,584,049 B2 | 9/2009 | Nomura |
| 7,587,433 B2 | 9/2009 | Peleg et al. |
| 7,642,931 B2 | 1/2010 | Sato |
| 7,657,885 B2 | 2/2010 | Anderson |
| 7,665,081 B1 | 2/2010 | Pavlyushchik |
| 7,668,871 B1 | 2/2010 | Cai et al. |
| 7,681,192 B2 | 3/2010 | Dietsch et al. |
| 7,734,387 B1 | 6/2010 | Young et al. |
| 7,802,243 B1 | 9/2010 | Feeser et al. |
| 7,805,720 B2 | 9/2010 | Chang et al. |
| 7,853,405 B2 | 12/2010 | Yamamoto |
| 7,865,890 B2 | 1/2011 | Sumi et al. |
| 7,890,427 B1 | 2/2011 | Rao et al. |
| 7,904,895 B1 | 3/2011 | Cassapakis et al. |
| 7,934,209 B2 | 4/2011 | Zimmer et al. |
| 7,941,656 B2 | 5/2011 | Hans et al. |
| 8,010,959 B2 | 8/2011 | Mullis et al. |
| 8,078,349 B1 | 12/2011 | Prada Gomez et al. |
| 8,095,301 B2 | 1/2012 | Kawamura |
| 8,112,165 B2 | 2/2012 | Meyer et al. |
| 8,145,376 B2 | 3/2012 | Sherony |
| 8,146,075 B2 | 3/2012 | Mahajan |
| 8,170,739 B2 | 5/2012 | Lee |
| 8,229,618 B2 | 7/2012 | Tolstedt et al. |
| 8,261,256 B1 | 9/2012 | Adler et al. |
| 8,266,612 B2 | 9/2012 | Rathi et al. |
| 8,271,972 B2 | 9/2012 | Braghiroli |
| 8,326,486 B2 | 12/2012 | Moinzadeh et al. |
| 8,375,108 B2 | 2/2013 | Aderton et al. |
| 8,392,907 B2 | 3/2013 | Oshiumi et al. |
| 8,397,230 B2 | 3/2013 | Ewington et al. |
| 8,428,649 B2 | 4/2013 | Yan et al. |
| 8,429,643 B2 | 4/2013 | Venkatachalam et al. |
| 8,437,890 B2 | 5/2013 | Anderson et al. |
| 8,457,827 B1 | 6/2013 | Ferguson et al. |
| 8,468,243 B2 | 6/2013 | Ogawa et al. |
| 8,495,618 B1 | 7/2013 | Inbaraj et al. |
| 8,516,142 B2 | 8/2013 | Lee et al. |
| 8,543,261 B2 | 9/2013 | Anderson et al. |
| 8,549,511 B2 | 10/2013 | Seki et al. |
| 8,578,361 B2 | 11/2013 | Cassapakis et al. |
| 8,612,153 B2 | 12/2013 | Nomura et al. |
| 8,612,773 B2 | 12/2013 | Nataraj et al. |
| 8,676,427 B1 | 3/2014 | Ferguson et al. |
| 8,706,394 B2 | 4/2014 | Trepagnier et al. |
| 8,712,624 B1 | 4/2014 | Ferguson et al. |
| 8,744,648 B2 | 6/2014 | Anderson et al. |
| 8,781,707 B2 | 7/2014 | Kawawa et al. |
| 8,781,715 B2 | 7/2014 | Breed |
| 8,813,061 B2 | 8/2014 | Hoffman et al. |
| 8,880,270 B1 | 11/2014 | Ferguson et al. |
| 8,880,272 B1 | 11/2014 | Ferguson et al. |
| 8,996,234 B1 | 3/2015 | Tamari et al. |
| 9,008,961 B2 | 4/2015 | Nemec et al. |
| 9,045,118 B2 | 6/2015 | Taguchi et al. |
| 9,070,305 B1 | 6/2015 | Raman et al. |
| 9,081,383 B1 | 7/2015 | Montemerlo et al. |
| 9,090,259 B2 | 7/2015 | Dolgov et al. |
| 9,096,267 B2 | 8/2015 | Mudalige et al. |
| 9,097,549 B1 | 8/2015 | Rao et al. |
| 9,110,196 B2 | 8/2015 | Urmson et al. |
| 9,120,485 B1 | 9/2015 | Dolgov |
| 9,128,798 B2 | 9/2015 | Hoffman et al. |
| 9,139,199 B2 | 9/2015 | Harvey |
| 9,176,500 B1 | 11/2015 | Teller et al. |
| 9,187,117 B2 | 11/2015 | Spero et al. |
| 9,188,982 B2 | 11/2015 | Thomson |
| 9,196,164 B1 | 11/2015 | Urmson et al. |
| 9,202,382 B2 | 12/2015 | Klinger et al. |
| 9,218,739 B2 | 12/2015 | Trombley et al. |
| 9,243,537 B1 | 1/2016 | Ge |
| 9,314,924 B1 | 4/2016 | Laurent et al. |
| 9,321,461 B1 | 4/2016 | Silver |
| 9,348,577 B2 | 5/2016 | Hoffman et al. |
| 9,349,284 B2 | 5/2016 | Cudak |
| 9,354,075 B2 | 5/2016 | Kim |
| 9,365,213 B2 | 6/2016 | Stennethe et al. |
| 9,399,472 B2 | 7/2016 | Minoiu-Enache |
| 9,412,280 B1 | 8/2016 | Zwillinger et al. |
| 9,465,388 B1 | 10/2016 | Fairfield et al. |
| 9,493,158 B2 | 11/2016 | Harvey |
| 9,519,290 B2 | 12/2016 | Kojo |
| 9,523,984 B1 | 12/2016 | Herbach |
| 9,534,910 B2 | 1/2017 | Okumura |
| 9,547,307 B1 | 1/2017 | Cullinane |
| 9,547,986 B1 | 1/2017 | Curlander et al. |
| 9,555,736 B2 | 1/2017 | Solar et al. |
| 9,557,736 B1 | 1/2017 | Silver |
| 9,566,899 B2 | 2/2017 | Foltin |
| 9,568,915 B1 | 2/2017 | Berntorp et al. |
| 9,587,952 B1 | 3/2017 | Slusar |
| 9,594,373 B2 | 3/2017 | Solyom |
| 9,600,768 B1 | 3/2017 | Ferguson |
| 9,625,261 B2 | 4/2017 | Polansky |
| 9,645,577 B1 | 5/2017 | Frazzoli |
| 9,648,023 B2 | 5/2017 | Hoffman et al. |
| 9,671,785 B1 | 6/2017 | Bhatia et al. |
| 9,682,707 B1 | 6/2017 | Silver |
| 9,688,199 B2 | 6/2017 | Koravadi |
| 9,729,636 B2 | 8/2017 | Koravadi et al. |
| 9,734,528 B2 | 8/2017 | Gromley |
| 9,740,945 B2 | 8/2017 | Divekar et al. |
| 9,789,809 B2 | 10/2017 | Foltin |
| 9,841,763 B1 | 12/2017 | Valois |
| 9,881,220 B2 | 1/2018 | Koravadi |
| 9,881,501 B2 | 1/2018 | Weber |
| 9,898,008 B2 | 2/2018 | Xu et al. |
| 9,910,440 B2 | 3/2018 | Wei et al. |
| 9,921,585 B2 | 3/2018 | Ichikawa et al. |
| 2002/0035422 A1 | 3/2002 | Sasaki |
| 2003/0043269 A1 | 3/2003 | Park |
| 2003/0060973 A1 | 3/2003 | Mathews et al. |
| 2003/0112132 A1 | 6/2003 | Trajkovic et al. |
| 2003/0125864 A1 | 7/2003 | Banno et al. |
| 2003/0125871 A1 | 7/2003 | Cherveny et al. |
| 2004/0054995 A1 | 3/2004 | Lee |
| 2004/0093196 A1 | 5/2004 | Hawthorne et al. |
| 2004/0167702 A1 | 8/2004 | Isogai et al. |
| 2005/0065711 A1 | 3/2005 | Dahlgren et al. |
| 2005/0093720 A1 | 5/2005 | Yamane |
| 2005/0134710 A1 | 6/2005 | Nomura et al. |
| 2005/0143889 A1 | 6/2005 | Isaji et al. |
| 2005/0206142 A1 | 9/2005 | Prakah-Asante et al. |
| 2005/0273256 A1 | 12/2005 | Takahashi |
| 2005/0283699 A1 | 12/2005 | Nomura et al. |
| 2006/0103590 A1 | 5/2006 | Divon |
| 2006/0174240 A1 | 8/2006 | Flynn |
| 2006/0195257 A1 | 8/2006 | Nakamura |
| 2006/0217939 A1 | 9/2006 | Nakate et al. |
| 2006/0242206 A1 | 10/2006 | Brezak et al. |
| 2007/0001831 A1 | 1/2007 | Raz et al. |
| 2007/0055446 A1 | 3/2007 | Schiffmann et al. |
| 2007/0061074 A1 | 3/2007 | Safoutin |
| 2007/0061779 A1 | 3/2007 | Dowedeit et al. |

(56) References Cited

U.S. PATENT DOCUMENTS

| | | |
|---|---|---|
| 2007/0087756 A1 | 4/2007 | Hoffberg |
| 2007/0124029 A1 | 5/2007 | Hattori |
| 2007/0142995 A1 | 6/2007 | Wotlermann |
| 2007/0162905 A1 | 7/2007 | Kooijmans |
| 2007/0185624 A1 | 8/2007 | Duddles et al. |
| 2007/0225900 A1 | 9/2007 | Kropp |
| 2007/0226726 A1 | 9/2007 | Robsahm |
| 2007/0229310 A1 | 10/2007 | Sato |
| 2007/0253261 A1 | 11/2007 | Uchida et al. |
| 2007/0255764 A1 | 11/2007 | Sonnier et al. |
| 2007/0265767 A1 | 11/2007 | Yamamoto |
| 2008/0001919 A1 | 1/2008 | Pascucci |
| 2008/0005733 A1 | 1/2008 | Ramachandran et al. |
| 2008/0046174 A1 | 2/2008 | Johnson |
| 2008/0071460 A1 | 3/2008 | Lu |
| 2008/0119993 A1 | 5/2008 | Breed |
| 2008/0134165 A1 | 6/2008 | Anderson et al. |
| 2008/0140278 A1 | 6/2008 | Breed |
| 2008/0162027 A1 | 7/2008 | Murphy et al. |
| 2008/0184785 A1 | 8/2008 | Wee |
| 2008/0201702 A1 | 8/2008 | Bunn |
| 2008/0244757 A1 | 10/2008 | Nakagaki |
| 2008/0266168 A1 | 10/2008 | Aso et al. |
| 2008/0303696 A1 | 12/2008 | Aso et al. |
| 2009/0024357 A1 | 1/2009 | Aso et al. |
| 2009/0058677 A1 | 3/2009 | Tseng et al. |
| 2009/0062992 A1 | 3/2009 | Jacobs et al. |
| 2009/0070031 A1 | 3/2009 | Ginsberg |
| 2009/0079839 A1 | 3/2009 | Fischer et al. |
| 2009/0089775 A1 | 4/2009 | Zusman |
| 2009/0174573 A1 | 7/2009 | Smith |
| 2009/0177502 A1 | 7/2009 | Doinoff et al. |
| 2009/0237263 A1 | 9/2009 | Sawyer |
| 2009/0271084 A1 | 10/2009 | Taguchi |
| 2009/0299630 A1 | 12/2009 | Denaro |
| 2009/0312942 A1 | 12/2009 | Froeberg |
| 2010/0088011 A1 | 4/2010 | Bruce et al. |
| 2010/0100268 A1 | 4/2010 | Zhang et al. |
| 2010/0198513 A1 | 8/2010 | Zeng et al. |
| 2010/0228419 A1 | 9/2010 | Lee et al. |
| 2010/0228427 A1 | 9/2010 | Anderson et al. |
| 2010/0256836 A1 | 10/2010 | Mudalige |
| 2010/0274430 A1 | 10/2010 | Dolgov et al. |
| 2010/0286824 A1 | 11/2010 | Solomon |
| 2010/0317401 A1 | 12/2010 | Lee et al. |
| 2011/0066312 A1 | 3/2011 | Sung et al. |
| 2011/0080302 A1 | 4/2011 | Muthaiah et al. |
| 2011/0102195 A1 | 5/2011 | Kushi et al. |
| 2011/0106442 A1 | 5/2011 | Desai et al. |
| 2011/0137549 A1 | 6/2011 | Gupta et al. |
| 2011/0141242 A1 | 6/2011 | Fernandez Alvates et al. |
| 2011/0153166 A1 | 6/2011 | Yester |
| 2011/0184605 A1 | 7/2011 | Neff |
| 2011/0190972 A1 | 8/2011 | Timmons |
| 2011/0197187 A1 | 8/2011 | Roh |
| 2011/0231095 A1 | 9/2011 | Nakada et al. |
| 2011/0252415 A1 | 10/2011 | Ricci |
| 2011/0265075 A1 | 10/2011 | Lee |
| 2011/0307879 A1 | 12/2011 | Ishida et al. |
| 2012/0010797 A1 | 1/2012 | Luo et al. |
| 2012/0016581 A1 | 1/2012 | Mochizuki et al. |
| 2012/0017207 A1 | 1/2012 | Mahajan et al. |
| 2012/0109421 A1 | 5/2012 | Scarola |
| 2012/0110296 A1 | 5/2012 | Harata |
| 2012/0112895 A1 | 5/2012 | Jun |
| 2012/0124568 A1 | 5/2012 | Fallon et al. |
| 2012/0124571 A1 | 5/2012 | Nagai et al. |
| 2012/0140039 A1 | 6/2012 | Ota |
| 2012/0179362 A1 | 7/2012 | Stille |
| 2012/0242167 A1 | 9/2012 | Zeung et al. |
| 2012/0266156 A1 | 10/2012 | Spivak et al. |
| 2012/0268262 A1 | 10/2012 | Popovic |
| 2012/0271510 A1 | 10/2012 | Seymour et al. |
| 2012/0275524 A1 | 11/2012 | Lien et al. |
| 2012/0323402 A1 | 12/2012 | Murakami |
| 2013/0018572 A1 | 1/2013 | Jang |
| 2013/0046471 A1 | 2/2013 | Rahmes et al. |
| 2013/0054133 A1 | 2/2013 | Lewis et al. |
| 2013/0055231 A1 | 2/2013 | Hyndman et al. |
| 2013/0079950 A1 | 3/2013 | You |
| 2013/0085817 A1 | 4/2013 | Pinkus |
| 2013/0099911 A1 | 4/2013 | Mudalige et al. |
| 2013/0151058 A1 | 6/2013 | Zagorski et al. |
| 2013/0167131 A1 | 6/2013 | Carson |
| 2013/0174050 A1 | 7/2013 | Heinonen et al. |
| 2013/0184926 A1 | 7/2013 | Spero et al. |
| 2013/0223686 A1 | 8/2013 | Shimizu |
| 2013/0227538 A1 | 8/2013 | Maruyama |
| 2013/0238235 A1 | 9/2013 | Kitchel |
| 2013/0245877 A1 | 9/2013 | Ferguson et al. |
| 2013/0253754 A1 | 9/2013 | Ferguson et al. |
| 2013/0261952 A1 | 10/2013 | Aso et al. |
| 2013/0297172 A1 | 11/2013 | Ariga et al. |
| 2013/0304349 A1 | 11/2013 | Davidson |
| 2013/0304365 A1 | 11/2013 | Trombley et al. |
| 2013/0325241 A1 | 12/2013 | Lombrozo |
| 2013/0328916 A1 | 12/2013 | Arikan et al. |
| 2013/0332918 A1 | 12/2013 | Aoyagi et al. |
| 2013/0335569 A1 | 12/2013 | Einecke et al. |
| 2013/0338854 A1 | 12/2013 | Yamamoto |
| 2013/0339721 A1 | 12/2013 | Yasuda |
| 2014/0013015 A1 | 1/2014 | Chang |
| 2014/0018994 A1 | 1/2014 | Panzarella et al. |
| 2014/0059534 A1 | 2/2014 | Daum et al. |
| 2014/0062725 A1 | 3/2014 | Maston |
| 2014/0063232 A1 | 3/2014 | Fairfield et al. |
| 2014/0067488 A1 | 3/2014 | James et al. |
| 2014/0068594 A1 | 3/2014 | Young et al. |
| 2014/0088855 A1 | 3/2014 | Ferguson |
| 2014/0104077 A1 | 4/2014 | Engel et al. |
| 2014/0112538 A1 | 4/2014 | Ogawa et al. |
| 2014/0136414 A1 | 5/2014 | Abhyanker |
| 2014/0149153 A1 | 5/2014 | Cassandras et al. |
| 2014/0156182 A1 | 6/2014 | Nemec et al. |
| 2014/0168377 A1 | 6/2014 | Cluff et al. |
| 2014/0176350 A1 | 6/2014 | Niehsen et al. |
| 2014/0195093 A1 | 7/2014 | Litkouhi et al. |
| 2014/0204209 A1 | 7/2014 | Huth et al. |
| 2014/0207325 A1 | 7/2014 | Mudalige et al. |
| 2014/0222280 A1 | 8/2014 | Salomonsson |
| 2014/0245285 A1 | 8/2014 | Krenz |
| 2014/0266665 A1 | 9/2014 | Haushalter |
| 2014/0272894 A1 | 9/2014 | Grimes et al. |
| 2014/0278052 A1 | 9/2014 | Slavin et al. |
| 2014/0278090 A1 | 9/2014 | Boes et al. |
| 2014/0288810 A1 | 9/2014 | Donovan et al. |
| 2014/0303827 A1 | 10/2014 | Dolgov et al. |
| 2014/0309856 A1 | 10/2014 | Willson-Quayle |
| 2014/0309885 A1 | 10/2014 | Ricci |
| 2014/0327532 A1 | 11/2014 | Park |
| 2014/0330479 A1 | 11/2014 | Dolgov et al. |
| 2014/0334168 A1 | 11/2014 | Ehlgen et al. |
| 2014/0334689 A1 | 11/2014 | Butler et al. |
| 2014/0336935 A1 | 11/2014 | Zhu et al. |
| 2014/0371987 A1 | 12/2014 | Van Wiemeersch |
| 2015/0006012 A1 | 1/2015 | Kammek et al. |
| 2015/0012204 A1 | 1/2015 | Breuer et al. |
| 2015/0032290 A1 | 1/2015 | Kitahama et al. |
| 2015/0046076 A1 | 2/2015 | Costello |
| 2015/0051785 A1 | 2/2015 | Pal et al. |
| 2015/0081156 A1 | 3/2015 | Trepagnier et al. |
| 2015/0088357 A1 | 3/2015 | Yopp |
| 2015/0094943 A1 | 4/2015 | Yoshihama et al. |
| 2015/0100216 A1 | 4/2015 | Rayes |
| 2015/0120125 A1 | 4/2015 | Thomson et al. |
| 2015/0121071 A1 | 4/2015 | Schwarz |
| 2015/0123816 A1 | 5/2015 | Breed |
| 2015/0124096 A1 | 5/2015 | Koravadi |
| 2015/0134180 A1 | 5/2015 | An et al. |
| 2015/0149017 A1 | 5/2015 | Attard et al. |
| 2015/0154243 A1 | 6/2015 | Danaher |
| 2015/0154323 A1 | 6/2015 | Koch |
| 2015/0160024 A1 | 6/2015 | Fowe |
| 2015/0161895 A1 | 6/2015 | You et al. |

(56) References Cited

U.S. PATENT DOCUMENTS

| | | |
|---|---|---|
| 2015/0166069 A1 | 6/2015 | Engel et al. |
| 2015/0178998 A1 | 6/2015 | Attard et al. |
| 2015/0191135 A1 | 7/2015 | Noon et al. |
| 2015/0191136 A1 | 7/2015 | Noon et al. |
| 2015/0210274 A1 | 7/2015 | Clarke et al. |
| 2015/0219463 A1 | 8/2015 | Kang |
| 2015/0253778 A1 | 9/2015 | Rothoff et al. |
| 2015/0266488 A1 | 9/2015 | Solyom |
| 2015/0268665 A1 | 9/2015 | Ludwich et al. |
| 2015/0279210 A1 | 10/2015 | Zafiroglu et al. |
| 2015/0285644 A1 | 10/2015 | Pfaff et al. |
| 2015/0292894 A1 | 10/2015 | Goddard et al. |
| 2015/0293534 A1 | 10/2015 | Takamatsu |
| 2015/0307131 A1 | 10/2015 | Froeschl et al. |
| 2015/0310744 A1 | 10/2015 | Farrelly et al. |
| 2015/0319093 A1* | 11/2015 | Stolfus ............... H04L 12/6418 370/237 |
| 2015/0329107 A1 | 11/2015 | Meyer et al. |
| 2015/0332101 A1 | 11/2015 | Takaki et al. |
| 2015/0336502 A1 | 11/2015 | Hillis et al. |
| 2015/0338849 A1 | 11/2015 | Nemec et al. |
| 2015/0339928 A1 | 11/2015 | Ramanujam |
| 2015/0345959 A1 | 12/2015 | Meuleau |
| 2015/0345966 A1 | 12/2015 | Meuleau |
| 2015/0345967 A1 | 12/2015 | Meuleau |
| 2015/0345971 A1 | 12/2015 | Meuleau et al. |
| 2015/0346724 A1 | 12/2015 | Jones et al. |
| 2015/0346727 A1 | 12/2015 | Ramanujam |
| 2015/0348112 A1 | 12/2015 | Ramanujam |
| 2015/0353082 A1 | 12/2015 | Lee et al. |
| 2015/0353085 A1 | 12/2015 | Lee et al. |
| 2015/0353094 A1 | 12/2015 | Harda et al. |
| 2015/0355641 A1 | 12/2015 | Choi et al. |
| 2015/0358329 A1 | 12/2015 | Noda et al. |
| 2015/0360692 A1 | 12/2015 | Ferguson et al. |
| 2015/0379468 A1 | 12/2015 | Harvey |
| 2016/0013934 A1 | 1/2016 | Smereka et al. |
| 2016/0016127 A1 | 1/2016 | Mentzel et al. |
| 2016/0016525 A1 | 1/2016 | Chauncey et al. |
| 2016/0025505 A1 | 1/2016 | Oh et al. |
| 2016/0033964 A1 | 2/2016 | Sato et al. |
| 2016/0041820 A1 | 2/2016 | Ricci et al. |
| 2016/0047657 A1 | 2/2016 | Caylor et al. |
| 2016/0047666 A1 | 2/2016 | Fuchs |
| 2016/0075333 A1 | 3/2016 | Sujan et al. |
| 2016/0078758 A1 | 3/2016 | Basalamah |
| 2016/0107655 A1 | 4/2016 | Desnoyer et al. |
| 2016/0109245 A1 | 4/2016 | Denaro |
| 2016/0117923 A1 | 4/2016 | Dannenbring |
| 2016/0121482 A1 | 5/2016 | Bostick et al. |
| 2016/0129907 A1 | 5/2016 | Kim et al. |
| 2016/0137199 A1 | 5/2016 | Kuhne et al. |
| 2016/0137206 A1 | 5/2016 | Chandraker et al. |
| 2016/0138924 A1 | 5/2016 | An |
| 2016/0139594 A1 | 5/2016 | Okumura et al. |
| 2016/0139598 A1 | 5/2016 | Ichikawa et al. |
| 2016/0139600 A1 | 5/2016 | Delp |
| 2016/0147921 A1 | 5/2016 | VanHolme |
| 2016/0148063 A1 | 5/2016 | Hong et al. |
| 2016/0161266 A1 | 6/2016 | Crawford et al. |
| 2016/0161270 A1 | 6/2016 | Okumura |
| 2016/0161271 A1 | 6/2016 | Okumura |
| 2016/0167652 A1 | 6/2016 | Slusar |
| 2016/0176398 A1 | 6/2016 | Prokhorov et al. |
| 2016/0180707 A1 | 6/2016 | MacNeille et al. |
| 2016/0209843 A1 | 7/2016 | Meuleau et al. |
| 2016/0231122 A1 | 8/2016 | Beaurepaire |
| 2016/0231746 A1 | 8/2016 | Hazelton et al. |
| 2016/0239293 A1 | 8/2016 | Hoffman et al. |
| 2016/0260328 A1 | 9/2016 | Mishra et al. |
| 2016/0266581 A1 | 9/2016 | Dolgov et al. |
| 2016/0280264 A1 | 9/2016 | Baek |
| 2016/0282874 A1 | 9/2016 | Kurata et al. |
| 2016/0288788 A1 | 10/2016 | Nagasaka |
| 2016/0291155 A1 | 10/2016 | Nehmadi et al. |
| 2016/0318437 A1 | 11/2016 | Vilakathara |
| 2016/0318531 A1 | 11/2016 | Johnson et al. |
| 2016/0321551 A1 | 11/2016 | Priness et al. |
| 2016/0332574 A1 | 11/2016 | Park et al. |
| 2016/0334229 A1 | 11/2016 | Ross et al. |
| 2016/0334230 A1 | 11/2016 | Ross et al. |
| 2016/0355192 A1 | 12/2016 | James et al. |
| 2016/0370194 A1 | 12/2016 | Colijn et al. |
| 2016/0370801 A1 | 12/2016 | Fairfield et al. |
| 2016/0379486 A1 | 12/2016 | Taylor |
| 2017/0010613 A1 | 1/2017 | Fukumoto |
| 2017/0016730 A1 | 1/2017 | Gawrilow |
| 2017/0024500 A1 | 1/2017 | Sebastian et al. |
| 2017/0059335 A1 | 3/2017 | Levine et al. |
| 2017/0059339 A1 | 3/2017 | Sugawara et al. |
| 2017/0082453 A1 | 3/2017 | Fischer et al. |
| 2017/0090480 A1 | 3/2017 | Ho et al. |
| 2017/0106871 A1 | 4/2017 | You et al. |
| 2017/0110022 A1 | 4/2017 | Gulash |
| 2017/0113683 A1 | 4/2017 | Mudalige et al. |
| 2017/0122766 A1 | 5/2017 | Nemec et al. |
| 2017/0123430 A1 | 5/2017 | Nath et al. |
| 2017/0139701 A1 | 5/2017 | Lin et al. |
| 2017/0153639 A1 | 6/2017 | Stein |
| 2017/0154225 A1 | 6/2017 | Stein |
| 2017/0192437 A1 | 7/2017 | Bier et al. |
| 2017/0219371 A1 | 8/2017 | Suzuki et al. |
| 2017/0242436 A1 | 8/2017 | Creusot |
| 2017/0245151 A1 | 8/2017 | Hoffman et al. |
| 2017/0248949 A1 | 8/2017 | Moran et al. |
| 2017/0249848 A1 | 8/2017 | Niino et al. |
| 2017/0276502 A1 | 9/2017 | Fischer et al. |
| 2017/0277193 A1 | 9/2017 | Frazzoli et al. |
| 2017/0277194 A1 | 9/2017 | Frazzoli et al. |
| 2017/0277195 A1 | 9/2017 | Frazzoli et al. |
| 2017/0286784 A1 | 10/2017 | Bhatia et al. |
| 2017/0291608 A1 | 10/2017 | Engel et al. |
| 2017/0292843 A1 | 10/2017 | Wei et al. |
| 2017/0305335 A1 | 10/2017 | Wei et al. |
| 2017/0305420 A1 | 10/2017 | Desens et al. |
| 2017/0309179 A1 | 10/2017 | Kodama |
| 2017/0327128 A1 | 11/2017 | Denaro |
| 2017/0336788 A1 | 11/2017 | Iagnemma |
| 2017/0337819 A1 | 11/2017 | Wei et al. |
| 2017/0341652 A1 | 11/2017 | Sugawara et al. |
| 2017/0345321 A1 | 11/2017 | Cross et al. |
| 2017/0349181 A1 | 12/2017 | Wei et al. |
| 2017/0351263 A1 | 12/2017 | Lambermont et al. |
| 2017/0356746 A1 | 12/2017 | Iagnemma |
| 2017/0356747 A1 | 12/2017 | Iagnemma |
| 2017/0356748 A1 | 12/2017 | Iagnemma |
| 2017/0356750 A1 | 12/2017 | Iagnemma |
| 2017/0356751 A1 | 12/2017 | Iagnemma |
| 2017/0369051 A1 | 12/2017 | Sakai et al. |
| 2018/0004206 A1 | 1/2018 | Iagnemma |
| 2018/0004210 A1 | 1/2018 | Iagnemma et al. |
| 2018/0039269 A1 | 2/2018 | Lambermont et al. |
| 2018/0050664 A1 | 2/2018 | Tarte |
| 2018/0053276 A1 | 2/2018 | Iagnemma et al. |
| 2018/0053412 A1 | 2/2018 | Iagnemma et al. |
| 2018/0086280 A1 | 3/2018 | Nguyen |
| 2018/0113455 A1 | 4/2018 | Iagnemma et al. |
| 2018/0113456 A1 | 4/2018 | Iagnemma et al. |
| 2018/0113457 A1 | 4/2018 | Iagnemma et al. |
| 2018/0113459 A1 | 4/2018 | Bennie et al. |
| 2018/0113463 A1 | 4/2018 | Iagnemma et al. |
| 2018/0113470 A1 | 4/2018 | Iagnemma et al. |
| 2018/0114442 A1 | 4/2018 | Minemura et al. |
| 2018/0120845 A1 | 5/2018 | Lambermont et al. |
| 2018/0120859 A1 | 5/2018 | Eagelberg et al. |

FOREIGN PATENT DOCUMENTS

| | | |
|---|---|---|
| EP | 0436213 | 7/1991 |
| EP | 2381361 | 10/2011 |
| EP | 2639781 | 9/2013 |
| EP | 2955077 | 12/2015 |
| EP | 2982562 | 2/2016 |
| JP | 2005-189983 | 7/2005 |

(56) References Cited

FOREIGN PATENT DOCUMENTS

| | | |
|---|---|---|
| JP | 2009-102003 | 5/2009 |
| JP | 2009-251759 | 10/2009 |
| JP | 2010-086269 | 4/2010 |
| JP | 2011-253379 | 12/2011 |
| JP | 2013-242737 | 12/2013 |
| JP | 2015-044432 | 3/2015 |
| JP | 2016095627 | 5/2016 |
| JP | 2018-012478 | 1/2018 |
| KR | 10-2013-0085235 | 7/2013 |
| KR | 10-2014-0069749 | 6/2014 |
| KR | 10-2014-0130968 | 11/2014 |
| KR | 10-1480652 | 1/2015 |
| KR | 10-1590787 | 2/2016 |
| KR | 20160049017 | 5/2016 |
| WO | WO2007/053350 | 5/2007 |
| WO | WO2014/139821 | 9/2014 |
| WO | WO2015/008032 | 1/2015 |
| WO | WO2015/151055 | 10/2015 |
| WO | WO2016/018636 | 2/2016 |
| WO | WO2017/218563 | 12/2017 |
| WO | WO2018/005819 | 1/2018 |

OTHER PUBLICATIONS

U.S. Appl. No. 15/200,050, filed Jul. 1, 2016—Pending.
U.S. Appl. No. 15/182,313, filed Jun. 14, 2016—Pending.
U.S. Appl. No. 15/182,360, filed Jun. 14, 2016—Pending.
U.S. Appl. No. 15/182,365, filed Jun. 14, 2016—Pending.
U.S. Appl. No. 15/200,035, filed Jul. 1, 2016—Pending.
Kessels et al., "Electronic Horizon: Energy Management using Telematics Information", Vehicle Power and Propulsion Conference, 2007. VPPC 2007. IEEE, 6 pages.
Hammerschmidt, "Bosch to Focus on Cloud for Connected Car Services", EE Times Europe. Dec. 3, 2015, 4 pages.
"Gain Scheduling", Wikipedia, 1 page. https://en.wikipedia.org/wiki/Gain_scheduling.
http://www.bosch-presse.de/pressportal/en/connected-horizon---seeing-beyond-the-bends-ahead-35691.html.
Transaction history and application as filed of U.S. Appl. No. 15/182,281, filed Jun. 14, 2016.
Transaction history and application as filed of U.S. Appl. No. 15/200,050, filed Jul. 1, 2016.
Transaction history and application as filed of U.S. Appl. No. 15/182,313, filed Jun. 14, 2016.
Transaction history and application as filed of U.S. Appl. No. 15/182,360, filed Jun. 14, 2016.
Transaction history and application as filed of U.S. Appl. No. 15/182,365, filed Jun. 14, 2016.
Transaction history and application as filed of U.S. Appl. No. 15/200,035, filed Jul. 1, 2016.
International Search Report and Written Opinion from PCT application PCT/US2017/037294 dated Oct. 17, 2017 (22 pages).
Dolgov, Dmitri et al., "Path Planning for Autonomous Vehicles in Unknown Semi-structured Environments", International Journal of Robotics Research, vol. 29 Issue 5, pp. 485-501, Apr. 2010 (18 pages).
International Search Report and Written Opinion from PCT application PCT/US2017/040040 dated Sep. 15, 2017 (22 pages).
Transaction history of U.S. Appl. No. 15/182,281, filed Jun. 14, 2016 as of Jan. 9, 2018.
Transaction history of U.S. Appl. No. 15/200,050, filed Jul. 1, 2016 as of Jan. 9, 2018.
Transaction history of U.S. Appl. No. 15/182,313, filed Jun. 14, 2016 as of Jan. 9, 2018.
Transaction history of U.S. Appl. No. 15/182,360, filed Jun. 14, 2016 as of Jan. 9, 2018.
Transaction history of U.S. Appl. No. 15/182,365, filed Jun. 14, 2016 as of Jan. 9, 2018.
Transaction history of U.S. Appl. No. 15/200,035, filed Jul. 1, 2016 as of Jan. 9, 2018.

U.S. Appl. No 15/477,833, Ravichandran et al., filed Apr. 3, 2017.
U.S. Appl. No 15/624,780, Liu et al., filed Jun. 16, 2017.
U.S. Appl. No 15/624,802, Liu et al., filed Jun. 16, 2017.
U.S. Appl. No 15/624,819, Liu et al., filed Jun. 16, 2017.
U.S. Appl. No 15/624,838, Liu et al., filed Jun. 16, 2017.
U.S. Appl. No 15/624,839, Liu et al., filed Jun. 16, 2017.
U.S. Appl. No 15/624,857, Liu et al., filed Jun. 16, 2017.
Aguiar et al., "Path-following for non-minimum phase systems removes performance limitations," IEEE Transactions on Automatic Control, 2005, 50(2):234-239.
Aguiar et al., "Trajectory-tracking and path-following of underactuated autonomous vehicles with parametric modeling uncertainty," Transactions on Automatic Control, 2007, 52(8):1362-1379.
Amidi and Thorpe, "Integrated mobile robot control," International Society for Optics and Photonics, Boston, MA, 1991, 504-523.
Aoude et al., "Mobile agent trajectory prediction using Bayesian nonparametric reachability trees," American Institute of Aeronautics and Astronautics, 2011, 1587-1593.
Autoliv.com [online], "Vision Systems—another set of "eyes"," available on or before Sep. 8, 2012, retrieved Oct. 20, 2016,<https://www.autoliv.com/ProductsAndInnovations/ActiveSafetySystems/Pages/VisionSystems.aspx>, 2 pages.
Autonomoustuff.com [online], "ibeo Standard Four Layer Multi-Echo LUX Sensor: Bringing together the World's Best Technologies," available on or before Jul. 2016, retrieved on Feb. 7, 2017, <http://www.autonomoustuff.com/product/ibeo-lux-standard/>, 2 pages.
Bahlmann et al., "A system for traffic sign detection, tracking, and recognition using color, shape, and motion information." IEEE Intelligent Vehicles Symposium, 2005, 255-260.
Balabhadruni, "Intelligent traffic with connected vehicles: intelligent and connected traffic systems," IEEE International Conference on Electrical, Electronics, Signals, Communication, and Optimization, 2015, 2 pages (Abstract Only).
Bertozzi et al., "Stereo inverse perspective mapping: theory and applications" Image and Vision Computing, 1999, 16:585-590.
Betts, "A survey of numerical methods for trajectory optimization," AIAA Journal of Guidance, Control, and Dynamics, Mar.-Apr. 1998, 21(2):193-207.
Castro et al., "Incremental Sampling-based Algorithm for Minimum-violation Motion Planning", Decision and Control, IEEE 52nd Annual Conference, Dec. 2013, 3217-3224.
Chaudari et al., "Incremental Minimum-Violation Control Synthesis for Robots Interacting with External Agents," American Control Conference, Jun. 2014, <http://vision.ucla.edu/~pratikac/pub/chaudhari.wongpiromsarn.ea.acc14.pdf>, 1761-1768.
Chen et al., "Likelihood-Field-Model-Based Dynamic Vehicle Detection and Tracking for Self-Driving," IEEE Transactions on Intelligent Transportation Systems, Nov. 2016, 17(11):3142-3158.
d'Andrea-Novel et al., "Control of Nonholonomic Wheeled Mobile Robots by State Feedback Linearization," The International Journal of Robotics Research, Dec. 1995, 14(6):543-559.
de la Escalera et al., "Road traffic sign detection and classification," IEEE Transactions on Industrial Electronics, Dec. 1997, 44(6):848-859.
Delphi.com [online], "Delphi Electronically Scanning Radar: Safety Electronics," retrieved on Feb. 7, 2017, <http://delphi.com/manufacturers/auto/safety/active/electronically-scanning-radar>, 4 pages.
Demiris, "Prediction of intent in robotics and multi-agent systems." Cognitive Processing, 2007, 8(3):151-158.
Dominguez et al., "An optimization technique for positioning multiple maps for self-driving car's autonomous navigation," IEEEE International Conference on Intelligent Transportation Systems, 2015, 2694-2699.
Fairfield and Urmson, "Traffic light mapping and detection," In Proceedings of the International Conference on Robotics and Automation (ICRA), 2011, 6 pages.
Falcone et al., "A linear time varying model predictive control approach to the integrated vehicle dynamics control problem in autonomous systems," IEEE Conference on Decision and Control, 2007, 2980-2985.
Falcone et al., "A Model Predictive Control Approach for Combined Braking and Steering in Autonomous Vehicles", Ford Research

(56) References Cited

OTHER PUBLICATIONS

Laboratories, Mediterranean Conference on Control & Automation, 2007, <http://www.me.berkeley.edu/~frborrel/pdfpub/pub-20.pdf>, 6 pages.
Fong et al., "Advanced Interfaces for Vehicle Teleoperation: Collaborative Control Sensor Fusion Displays, and Remote Driving Tools", Autonomous Robots 11, 2001, 77-85.
Franke et al., "Autonomous driving goes downtown," IEEE Intelligent Systems and their Applications, 1998, 6:40-48.
Fraser, "Differential Synchronization," ACM: DocEng '09, Sep. 2009, <https://static.googleusercontent.com/media/research.google.com/en//pubs/archive/35605.pdf>, 13-20.
Garcia et al., "Model predictive control: theory and practice—a survey," Automatica, 1989, 25(3):335-348.
Gavrila and Philomin, "Real-time object detection for "smart" vehicles," In Proceedings of the Seventh IEEE International Conference on Computer Vision, 1999, 1:87-93.
Golovinsky et al., "Shape-based Recognition of 3D Point Clouds in Urban Environments," Proceedings of the 12th International Conference on Computer Vision, 2009, 2154-2161.
He et al., "Color-Based Road Detection in Urban Traffic Scenes," IEEE Transactions on Intelligent Transportation Systems, Dec. 2004, 5(4):309-318.
Himmelsback et al., "Fast Segmentation of 3D Point Clouds for Ground Vehicles," IEEE Intelligent Vehicles Symposium, Jul. 21-24, 2010, 6 pages.
IEEE Global Initiative for Ethical Consideration in Artificial Intelligence and Autonomous Systems, "Ethically Aligned Design: A Vision for Prioritizing Human Wellbeing with Artificial Intelligence and Autonomous Systems," IEEE Advancing Technology for Humanity, Dec. 13, 2016, 138 pages.
ISO.org, "ISO 14229-1:2006; Road Vehicles—Unified diagnostic services (UDS)—Part 1: Specification and requirements," International Standard Organization, 2006, retrieved on Apr. 4, 2018, <https://www.iso.org/standard/45293.html>, 2 pages (abstract).
ISO.org, "ISO 15765-3:2004; Road Vehicles—Diagnostics on Controller Area Networks (CAN)—Part 3: Implementation of unified diagnostic services (UDS on CAN)," International Standard Organization, Oct. 2004, retrieved on Apr. 4, 2018, <https://www.iso.org/obp/ui/#iso:std:iso:14229:-1:ed-1:v2:en>, 2 pages (abstract).
Jiang and Nijmeijer, "Tracking control of mobile robots: a case study in backstepping," Automatica, 1997, 33(7):1393-1399.
Kala, et al: "Motion Planning of Autonomous Vehicles on a Dual Carriageway without Speed Lanes", Electronics, Jan. 13, 2015 4(1):59-81.
Kanayama, "A Stable Tracking Control Method for an Autonomous Mobile Robot," International Conference on Robotics and Automation, 1990, 384-389.
Karaman and Frazzoli, "Sampling-based algorithms for optimal motion planning." Int. Journal of Robotics Research, Jun. 2011, <http://ares.lids.mit.edu/papers/Karaman.Frazzoli.IJRR11.pdf>, 30(7):846-894.
Karaman et al., "Sampling-based Algorithms for Optimal Motion Planning with Deterministic—Calculus Specifications", 2012 American Control Conference, Jun. 27-Jun. 29, 2012, 8 pages.
Kavraki et al., "Probabilistic roadmaps for path planning in high-dimensional configuration spaces." IEEE Transactions on Robotics and Automation, 1996, 12(4):566-580.
Kim, "Robust lane detection and tracking in challenging scenarios." IEEE Transactions on Intelligent Transportation Systems, 2008, 9(1):16-26.
Larson et al., "Securing Vehicles against Cyber Attacks," ACM, 2008, retrieved on [date], <http://dl.acm.org/citation.cfm?id=1413174>, 3 pages.
Lindner et al., "Robust recognition of traffic signals," IEEE Intelligent Vehicles Symposium, 2004, 5 pages.
Liu et al, "Nonlinear Stochastic Predictive Control with Unscented Transformation for Semi_Autonomous Vehicles," American Control Conference, Jun. 4-6, 2014, 5574-5579.
Liu et al., "Robust semi-autonomous vehicle control for roadway departure and obstacle avoidance," ICCAS, Oct. 20-23, 2013, 794-799.
Lobdell, "Robust Over-the-air Firmware Updates Using Program Flash Memory Swap on Kinetis Microcontrollers," Freescal Semiconductor Inc., 2012, retrieved on Apr. 11, 2018, <http://cache.freescale.com/flies/microcontrollers/doc/app_note/AN4533.pdf>, 20 pages.
Luzcando (searcher), "EIC 3600 Search Report," STIC—Scientific & Technical Information Center, Feb. 14, 2018, 20 pages.
Maldonado-Bascón et al., "Road-sign detection and recognition based on support vector machines," IEEE Transactions on Intelligent Transportation Systems, 2007, 8(2):264-278.
Mayne et al., "Constrained model predictive control: Stability and optimality," Automatica, 2000, 36(6):789-814.
Mobileye [online], "Advanced Driver Assistance Systems (ADAS) systems range on the spectrum of passive/active," Copyright 2017, retrieved on Oct. 20, 2016, <http://www.mobileye.com/our-technology/adas/>, 2 pages.
Mogelmose et al., "Vision-based traffic sign detection and analysis for intelligent driver assistance systems: Perspectives and survey," IEEE Transactions on Intelligent Transportation Systems, 2012, 13(4):1484-1497.
Morris et al., "Learning, modeling, and classification of vehicle track patterns from live video." IEEE Transactions on Intelligent Transportation Systems, 2008, 9(3):425-437.
Nilsson et al., "Conducting Forensic Investigations of Cyber Attacks on Automobiles In-Vehicle Networks," ICST, 2008, retrieved on Mar. 20, 2016, <http://dl.acm.org/citation.cfm?id=1363228>, 6 pages.
Nilsson et al., "A Framework for Self-Verification of Firmware Updates over the Air in Vehicle ECUs," IEEE: GLOBECOM Workshops, Nov. 2008, 5 pages.
Ollero and Amidi, "Predictive path tracking of mobile robots. application to the CMU Navlab," in 5th International Conference on Advanced Robotics, 1991, 91:1081-1086.
Paik et al., "Profiling-based Log Block Replacement Scheme in FTL for Update-intensive Executions," IEEE: Embedded and Ubiquitous Computing (EUC), Oct. 2011, 182-188.
Premebida et al., "A lidar and vision-based approach for pedestrian and vehicle detection and tracking." In Proceedings of the IEEE Intelligent Transportation Systems Conference, 2007, 1044-1049.
Premebida et al., "LIDAR and vision-based pedestrian detection system." Journal of Field Robotics, 2009, 26(9):696-711.
Ponomarev, "Augmented reality's future isn't glasses. It's the car," Venturebeat.com, available on or before, Aug. 2017, retrieved on Mar. 30, 2018, <https://venturebeat.com/2017/08/23/ar-will-drive-the-evolution-of-automated-cars/>, 4 pages.
Rankin et al., "Autonomous path planning navigation system used for site characterization," SPIE—International Society for Optics and Photonics, 1996, 176-186.
Shavel-Shwartz et al., "Avoiding a "Winter of Autonomous Driving": On a Formal Model of Safe, Scalable, Self-driving Cars," arXiv preprint, Aug. 17, 2017, 25 pages.
Shen et al., "A Robust Video based Traffic Light Detection Algorithm for Intelligent Vehicles," Proceedings of the IEEE Intelligent Vehicles Symposium, 2009, 521-526.
Shin, "Hot/Cold Clustering for Page Mapping in NAND Flash Memory," IEEE: Transactions on Consumer Electronics, Nov. 2011, 57(4):1728-1731.
Spieser et al, "Toward a systematic approach to the design and evaluation of automated mobility-on-demand systems: A case study in Singapore," Road Vehicle Automation, 2014, 229-245.
Standards.sae.org, "Taxonomy and Definitions for Terms Related to Driving Automation Systems for On-Road Motor Vehicles," SAE International, Sep. 2016, retrieved on Apr. 18, 2017, <http://standards.sae.org/j3016_201609/>, 3 pages.
Strahn et al., "Laser Scanner-Based Navigation for Commercial Vehicles," IEEE Intelligent Vehicles Symposium, Jun. 13-15, 2007, 969-974.
Steger et al, "Applicability of IEEE 802.11s for Automotive Wireless Software Updates," IEEE: Telecommunications (ConTEL), Jul. 2015, 8 pages.

(56) References Cited

OTHER PUBLICATIONS

Stokar, "Perform over-the-air updates for car ECUss," eMedia Asia Ltd., 2013, retrieved on Apr. 11, 2018, <http://www.eetasia.com/STATIC/PDF/201312/EEOL_2013DEC05_NET_EMS_TA_01.pdf?SOURCES=DOWNLOAD>, 3 pages.

Tabuada and Pappas, "Linear time logic control of discrete-time linear systems," IEEE Transactions on Automatic Control, 2006, 51(12):1862-1877.

Wallace et al., "First results in robot road-following," in IJCAI, 1985, 1089-1095.

Wang et al., "Lane detection and tracking using B-Snake," Image and Vision Computing, 2004, 22(4):269-280.

Wang et al., "Simultaneous localization, mapping and moving object tracking," The International Journal of Robotics Research, 2007, 26(9):889-916.

Weiskircher et al., "Predictive Guidance and Control Framework for (Semi-) Autonomous Vehicles in Public Traffic," IEEE Transactions on Control Systems Technology, 2017, 25(6):2034-2046.

Weiss et al., "Autonomous v. Tele-operated: How People Perceive Human-Robot Collaboration with HRP-2," Proceedings of the 4th ACM/IEEE international conference on Human robot interaction, 2009, 3 pages.

Wit et al., "Autonomous ground vehicle path tracking," Journal of Robotic Systems, 2004, 21(8):439-449.

Wu et al., "Data Sorting in Flash Memory," ACM, 2015, <http://dl.acm.org/citation.cfm?id=2747982.2665067>, 25 pages.

Yilmaz et al., "Object tracking: A survey," ACM Computing Surveys, 2006, 31 pages.

Zax, "A Software Update for Your Car? Ford reboots it infotainment system, following consumer complaints," MIT Technology Review, 2012, retrieved on Apr. 11, 2018, <http://www.technologyreview.com/view/427153/a-software-update-for-yourcar?/>, 6 pages.

Zheng et al, "Lane-level positioning system based on RFID and vision," IET International Conference on Intelligent and Connected Vehicles, 2016, 5 pages.

Florentine et al., "Pedestrian notification methods in autonomous vehicles for multi-class mobility-on-demand service." Proceedings of the Fourth International Conference on Human Agent Interaction, Oct. 4, 2016, pp. 387-392.

Pendleton et al., "Autonomous golf cars for public trial of mobility-on-demand service." Intelligent Robots and Systems (IROS), 2015 IEEE/RSJ International Conference on Sep. 28, 2018, pp. 1164-1171.

U.S. Appl. No. 15/182,281, filed Jun. 14, 2016, Iagnemma.
U.S. Appl. No. 15/200,050, filed Jul. 1, 2016, Iagnemma.
U.S. Appl. No. 15/182,313, filed Jun. 14, 2016, Iagnemma.
U.S. Appl. No. 15/182,360, filed Jun. 14, 2016, Iagnemma.
U.S. Appl. No. 16/186,289, filed Nov. 9, 2018, Iagnemma.
U.S. Appl. No. 15/182,365, filed Jun. 14, 2016, Iagnemma.
U.S. Appl. No. 15/200,035, filed Jul. 1, 2016, Iagnemma.

* cited by examiner

EXEMPLARY SCENARIO WHERE ROADWAY CONNECTIVITY CHARACTERISTICS ARE SUCH THAT IT IS IMPOSSIBLE FOR EGO VEHICLE TO DETECT VEHICLE MOVING AT SPEED V1 AT SUFFICIENT RANGE TO ENSURE SAFE MERGE

EXEMPLARY SCENARIO WHERE ROADWAY SPATIAL CHARACTERISTICS ARE SUCH THAT IT IS IMPOSSIBLE FOR THE EGO VEHICLE TO DETECT VEHICLE MOVING AT SPEED V1 AT SUFFICIENT RANGE TO ENSURE SAFE LEFT TURN

EXEMPLARY SCENARIO WHERE ROADWAY SPATIAL ORIENTATION, COUPLED WITH TIME OF DAY, LEADS TO "SUN BLINDING" OF SENSORS, RESULTING IN DEGRADED SENSOR PERFORMANCE

EXEMPLARY HAIRPIN TURN SCENARIO WHERE ROADWAY SPATIAL CHARACTERISTICS ARE SUCH THAT IT IS IMPOSSIBLE FOR THE EGO VEHICLE TO DETECT MOVING AT SPEED V1 AT SUFFICIENT RANGE TO ENSURE SAFE AVOIDANCE MANEUVER

EXEMPLARY STEEP HILL SCENARIO WHERE ROADWAY SLOPE IS SUCH THAT IT IS IMPOSSIBLE FOR THE EGO VEHICLE TO DETECT VEHICLE MOVING AT SPEED V1 SUFFICENT RANGE TO ENSURE SAFE AVOIDANCE MANEUVER

EXEMPLARY AUTONOMOUS VEHICLE SENSOR CONFIGURATION AND REPRESENTATIVE SENSING RANGES OF INDIVIDUAL SENSORS. IN THIS SCENERIO THE EGO VEHICLE CAN DETECT THE VEHICLE AT DISTANCE D1, MOVING AT VELOCITY V1, AT SUFFICIENT RANGE TO PERFORM AN AVOIDANCE MANEUVER, IF REQUIRED

ROUTE PLANNING FOR AN AUTONOMOUS VEHICLE

BACKGROUND

This description relates to route planning for an autonomous vehicle.

An autonomous vehicle can drive safely without human intervention during part of a journey or an entire journey.

An autonomous vehicle includes sensors, actuators, computers, and communication devices to enable automated generation and following of routes through the environment. Some autonomous vehicles have wireless two-way communication capability to communicate with remotely-located command centers that may be manned by human monitors, to access data and information stored in a cloud service, and to communicate with emergency services.

As shown in FIG. 1, in a typical use of an autonomous vehicle 10, a desired goal position 12 (e.g., a destination address or street intersection) may be identified in a variety of ways. The goal position may be specified by a rider (who may be, for example, an owner of the vehicle or a passenger in a mobility-as-a-service "robo-taxi" application). The goal position may be provided by an algorithm (which, for example, may be running on a centralized server in the cloud and tasked with optimizing the locations of a fleet of autonomous vehicles with a goal of minimizing rider wait times when hailing a robo-taxi). In some cases, the goal position may be provided by a process (e.g., an emergency process that identifies the nearest hospital as the goal position due to a detected medical emergency on board the vehicle).

Given a desired goal position, a routing algorithm 20 determines a route 14 through the environment from the vehicle's current position 16 to the goal position 12. We sometimes call this process "route planning." In some implementations, a route is a series of connected segments of roads, streets, and highways (which we sometimes refer to as road segments or simply segments).

Routing algorithms typically operate by analyzing road network information. Road network information typically is a digital representation of the structure, type, connectivity, and other relevant information about the road network. A road network is typically represented as a series of connected road segments. The road network information, in addition to identifying connectivity between road segments, may contain additional information about the physical and conceptual properties of each road segment, including but not limited to the geographic location, road name or number, road length and width, speed limit, direction of travel, lane edge boundary type, and any special information about a road segment such as whether it is a bus lane, whether it is a right-turn only or left-turn only lane, whether it is part of a highway, minor road, or dirt road, whether the road segment allows parking or standing, and other properties.

The routing algorithm typically identifies one or more candidate routes 22 from the current position to the goal position. Identification of the best, or optimal, route 14 from among the candidate routes is generally accomplished by employing algorithms (such as A*, D*, Dijkstra's algorithm, and others) that identify a route that minimizes a specified cost. This cost is typically a function of one or more criteria, often including the distance traveled along a candidate route, the expected time to travel along the candidate route when considering speed limits, traffic conditions, and other factors. The routing algorithm may identify one or more than one good routes to be presented to the rider (or other person, for example, an operator at a remote location) for selection or approval. In some cases, the one optimal route may simply be provided to a vehicle trajectory planning and control module 28, which has the function of guiding the vehicle toward the goal (we sometimes refer to the goal position or simply as the goal) along the optimal route.

Figure 2:
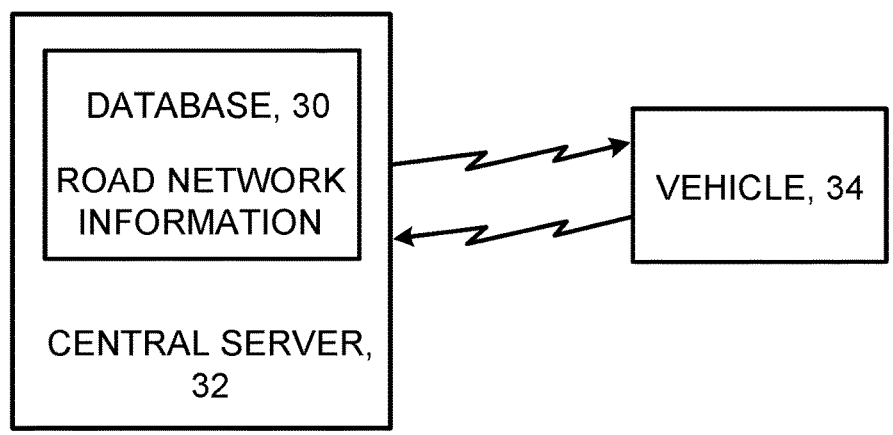

As shown in FIG. 2, road network information typically is stored in a database 30 that is maintained on a centrally accessible server 32 and may be updated at high frequency (e.g., 1 Hz or more). The network information can be accessed either on-demand (e.g., requested by the vehicle 34), or pushed to the vehicle by a server.

Road network information can have temporal information associated with it, to enable descriptions of traffic rules, parking rules, or other effects that are time dependent (e.g., a road segment that does not allow parking during standard business hours, or on weekends, for example), or to include information about expected travel time along a road segment at specific times of day (e.g., during rush hour).

SUMMARY

In general, in an aspect, a determination is made of and ability of an autonomous vehicle to safely or robustly travel a road feature or a road segment or a route that is being considered for the autonomous vehicle as of a time or range of times. The route conforms to properties of stored road network information. The road feature or road segment or route is eliminated from consideration if the computer has determined that the road feature or road segment or route cannot be safely or robustly traveled by the autonomous vehicle. The determination is based on analysis of performance of the autonomous vehicle.

Implementations may include one or a combination of two or more of the following features. The analysis of performance of the autonomous vehicle includes prior driving performance associated with road features. The analysis of performance of the autonomous vehicle includes prior simulation performance associated with road features.

These and other aspects, features, implementations, and advantages, and combinations of them, can be expressed as methods, systems, components, apparatus, program products, methods of doing business, means and steps for performing functions, and in other ways.

Other aspects, features, implementations, and advantages will become apparent from the following description and from the claims.

DESCRIPTION

Figure 3:
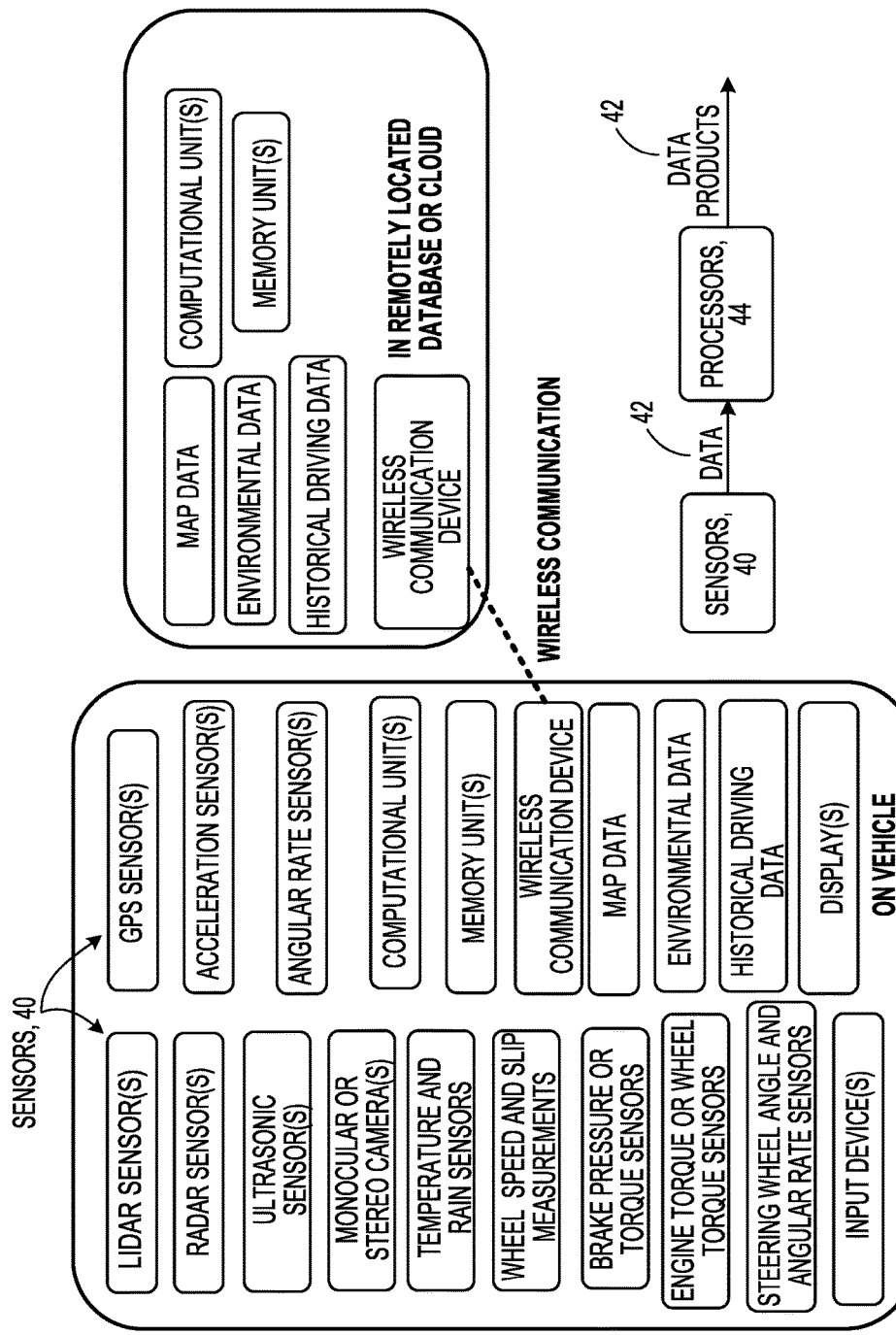

FIGS. 1 through 3 are block diagrams.
FIGS. 4 through 9 are schematic diagrams of roadway scenarios.
FIG. 10 is a schematic view of a vehicle and a remotely located database.

For route planning involving human-piloted vehicles, it is generally assumed that a route identified by a routing algorithm from a current position to a goal position that is composed of connected road segments is a route that can be driven safely by the driver. However, this assumption may not be valid for routes identified by the routing algorithm for an autonomous vehicle for various reasons. Autonomous vehicles may not be able to safely navigate certain road segments, intersections, or other geographic regions (which we will broadly refer to as road features) due to the specific properties of the road features and the vehicle's capabilities with respect to those road features. Also, autonomous vehicles may not be able to safely navigate certain road features during certain times of the day, periods of the year, or under certain weather conditions.

An example of the physical locations of sensors and software processes in a vehicle and at a cloud-based server and database is shown in FIGS. 3 and 10.

Sensors and Software Processes

In many cases, this inability to safely navigate road features relates to characteristics of sensors and software processes that the autonomous vehicle uses to perceive the environment, process data from the sensors, understand conditions that are currently presented by and may at future times be presented by the perceived environment, perform motion planning, perform motion control, and make decisions based on those perceptions and understandings. Among other things, under certain conditions and at certain times, the ability of the sensors and processes to perceive the environment, understand the conditions, perform motion planning and motion control, and make the decisions may be degraded or lost or may be subject to unacceptable variation.

Examples of such degradation or unacceptable variation of sensor and software process outputs are as follows:

Sensors for Perceiving the Vehicle's Environment

As shown on FIG. 3, sensors 40 of the following types are commonly available on vehicles that have a driver assistance capability or a highly automated driving capability (e.g., an autonomous vehicle): Sensors able to measure properties of the vehicle's environment including but not limited to, e.g., LIDAR, RADAR, monocular or stereo video cameras in the visible light, infrared, or thermal spectra, ultrasonic sensors, time-of-flight (TOF) depth sensors, as well as temperature and rain sensors, and combinations of them. Data 42 from such sensors can be processed 44 to yield "data products" 46, e.g., information about the type, position, velocity, and estimated future motion of other vehicles, pedestrians, cyclists, scooters, carriages, carts, animals, and other moving objects. Data products also include the position, type, and content of relevant objects and features such as static obstacles (e.g., poles, signs, curbs, traffic marking cones and barrels, traffic signals, traffic signs, road dividers, and trees), road markings, and road signs.

The ability of the software processes 44 to use such sensor data to compute such data products at specified levels of performance depends on the properties of the sensors, such as the detection range, resolution, noise characteristics, temperature dependence, and other factors. The ability to compute such data products at a specified level of performance may also depend on the environmental conditions, such as the properties of the ambient lighting (e.g., whether there is direct sunlight, diffuse sunlight, sunrise or sunset conditions, dusk, or darkness), the presence of mist, fog, smog, or air pollution, whether or not it is raining or snowing or has recently rained or snowed, and other factors.

Generally, it is possible to characterize the capability of a particular sensor (and associated processing software) to yield a data product of interest at a specific level of performance (e.g., a specific level of accuracy of detection, range of detection, rate of true or false positives, or other metric) as a function of a measurable metric relating to the environmental conditions. For example, it is generally possible to characterize the range at which a particular monocular camera sensor can detect moving vehicles at a specified performance level, as a function of ambient illumination levels associated with daytime and nighttime conditions.

Further, it is generally possible to identify specific failure modes of the sensor, i.e., conditions or circumstances where the sensor will reliably degrade or fail to generate a data product of interest, and to identify data products that the sensor has not been designed to be able to generate.

Figure 9:
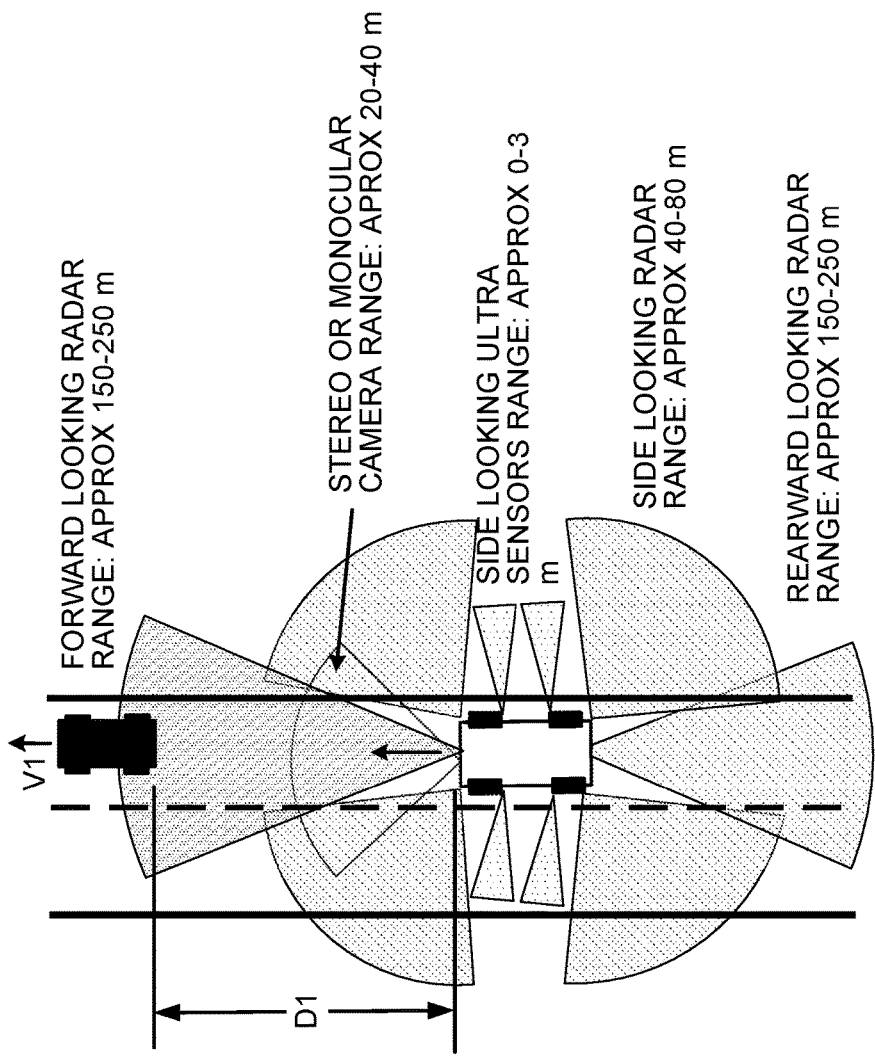
Figure 10:
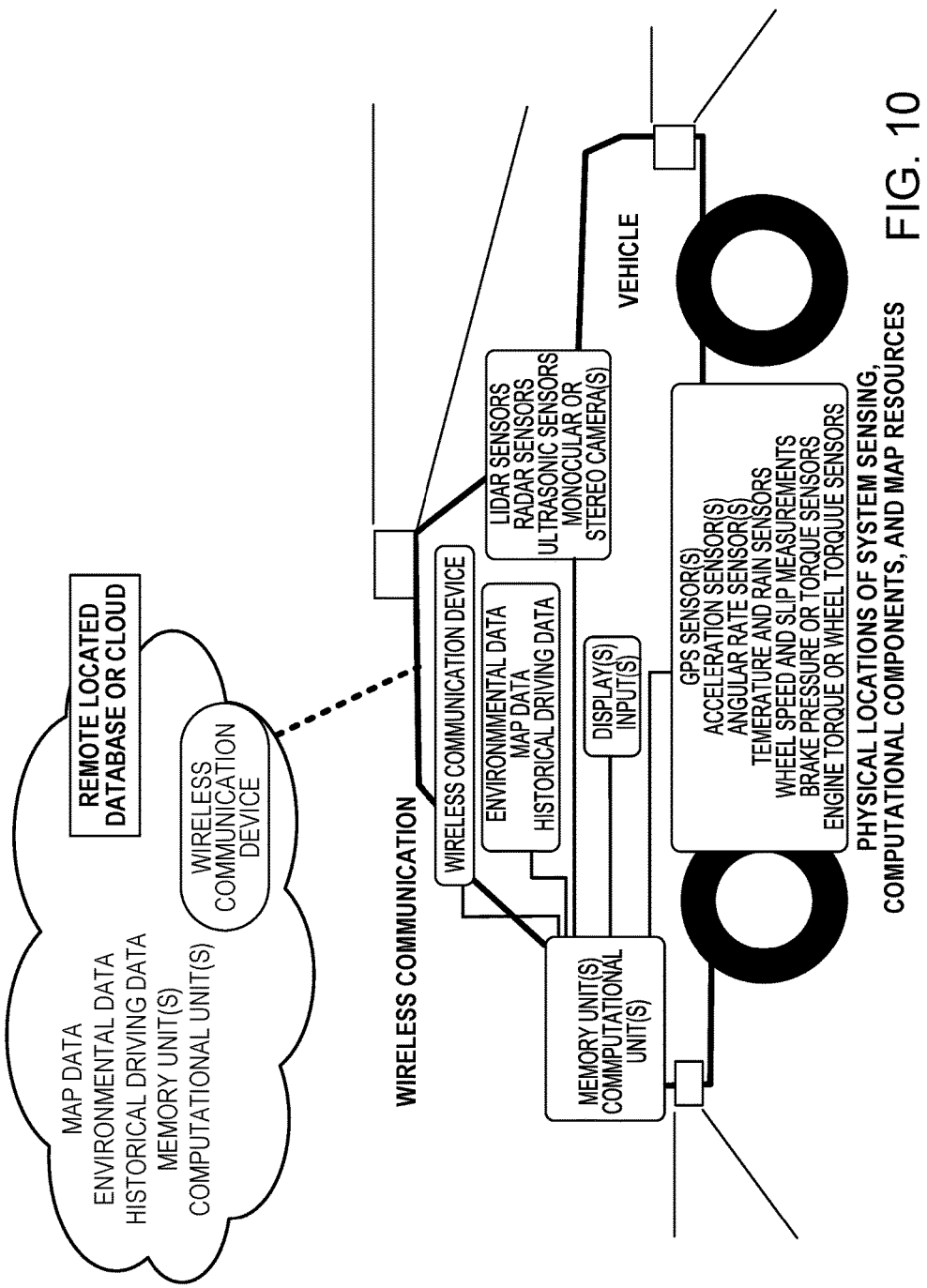

FIG. 9 shows an example of an autonomous vehicle sensor configuration.

Software for Processing Data from Sensors

As noted above, data from sensors can be used by software processes 44 to yield a variety of data products of interest. The ability of each of the software processes to generate data products that conform to specified levels of performance depends on properties of the sensor software processes (e.g., algorithms), which may limit their performance in scenarios with certain properties, such as a very high or very low density of data features relevant to the sensing task at hand.

For example, an algorithm (we sometimes use the terms software process and algorithm interchangeably) for pedestrian detection that relies on data from a monocular vision sensor may degrade or fail in its ability to detect, at a specified level of performance (e.g., a specified processing rate), more than a certain number of pedestrians and may therefore degrade or fail (in the sense of not detecting all pedestrians in a scene at the specified level of performance) in scenarios with a large number of pedestrians. Also, an algorithm for determining the location of the ego vehicle (termed "localization") based on comparison of LIDAR data collected from a vehicle-mounted sensor to data stored in a map database may fail in its ability to determine the vehicle's current position at a specified level of performance (e.g., at a specified degree of positional accuracy) in scenarios with little geometric relief, such as a flat parking lot.

Generally, it is possible to characterize the capability of a particular sensor software processes to yield a data product of interest at a specific level of performance as a function of measurable scenario properties.

Often the data provided by more than one sensor is combined in a data fusion framework implemented by one or more software processes, with an aim of improving the overall performance of computing a data product or data products. For example, data from a video camera can be combined with data from a LIDAR sensor to enable detection of pedestrians, at a level of performance that is designed to exceed the level of performance achievable through the use of either a video camera or LIDAR sensor alone. In data fusion scenarios such as this, the above remains true: it is generally possible to characterize the capability of a particular data fusion framework to yield a data product of interest at a specific level of performance.

Software Processes for Motion Planning

Vehicles capable of highly automated driving (e.g., autonomous vehicles) rely on a motion planning process, i.e., an algorithmic process to automatically generate and execute a trajectory through the environment toward a designated short-term goal. We use the term trajectory broadly to include, for example, a path from one place to another. To distinguish the trajectory that is generated by the motion planning process from the route that is generated by a route planning process, we note that trajectories are paths through the vehicle's immediate surroundings (e.g. with distance scales typically on the order of several meters to several hundred meters) that are specifically designed to be free of collisions with obstacles and often have desirable characteristics related to path length, ride quality, required travel time, lack of violation of rules of the road, adherence to driving practices, or other factors.

Some motion planning processes employed on autonomous vehicles exhibit known limitations. For example, a certain motion planning process may be able to compute paths for the vehicle from its current position to a goal under the assumption that the vehicle moves only in the forward direction, but not in reverse. Or, a certain motion planning process may be able to compute paths for a vehicle only when the vehicle is traveling at a speed that is less than a specified speed limit.

It is generally possible to identify these and similar performance characteristics (e.g., limitations) on a motion planning process, based on knowledge of the process's algorithmic design or its observed performance in simulation or experimental testing. Depending on the limitations of a particular motion planning process, it may prove difficult or impossible to navigate safely in specific regions, e.g., highways that require travel at high speeds, or multi-level parking structures that require complex multi-point turns involving both forward and reverse maneuvering.

Software Processes for Decision Making

Vehicles capable of highly automated driving rely on a decision making process, i.e., an algorithmic process, to automatically decide an appropriate short-term course of action for a vehicle at a given time, e.g., whether to pass a stopped vehicle or wait behind it; whether to proceed through a four-way stop intersection or yield to a vehicle that had previously arrived at the intersection.

Some decision making processes employed on autonomous vehicles exhibit known limitations. For example, a certain decision making process may not be able to determine an appropriate course of action for a vehicle in certain scenarios of high complexity, e.g., in roundabouts that include traffic lights, or in multi-level parking structures.

As in the case of motion planning processes, it is generally possible to identify these and similar performance characteristics (e.g., limitations) on a decision making process, based on knowledge of the process's algorithmic design or its observed performance in simulation or experimental testing. Depending on the limitations of a particular decision making process, it may prove difficult or impossible to navigate safely in specific regions.

Software Processes for Vehicle Motion Control

Autonomous vehicles generally aim to follow the trajectory provided by a motion planning process with a high degree of precision by employing a motion control process. Motion control processes compute a set of control inputs (i.e., steering, brake, and throttle inputs) based on analysis of the current and predicted deviation from a desired trajectory and other factors.

Such motion control processes exhibit known limitations. For example, a certain motion control process may allow for stable operation only in the forward direction, but not in reverse. Or, a certain motion control process may possess the capability to track (to a specified precision) a desired trajectory only when the vehicle is traveling at a speed that is less than a specified speed limit. Or, a certain motion control process may possess the capability to execute steering or braking inputs requiring a certain level of lateral or longitudinal acceleration only when the road surface friction coefficient exceeds a certain specified level.

As in the case of motion planning and decision making processes, it is generally possible to identify these and similar limitations on a motion control process, based on knowledge of the processes' algorithmic design, or its observed performance in simulation or experimental testing. Depending on the limitations of a particular motion control process, it may prove difficult or impossible to navigate safely in specific regions.

Safe or robust operation of the autonomous vehicle can be determined based on specific levels of performance of sensors and software processes as functions of current and future conditions.

Characteristics of Road Features

The route planning process aims to exclude candidate routes that include road features that can be determined to be not safely navigable by an autonomous vehicle. For this purpose the route planning process can usefully consider sources of information that are specifically relevant to autonomous vehicles, including information about characteristics of road features such as spatial characteristics, orientation, surface characteristics, and others. Generally, such information would be used to avoid routing the autonomous vehicle through areas of the road network that would be difficult or impossible for the vehicle to navigate at a required level of performance or safety. Examples of sources of information, and an explanation of their effects on autonomous vehicle performance or safety, are described here.

Figure 5:
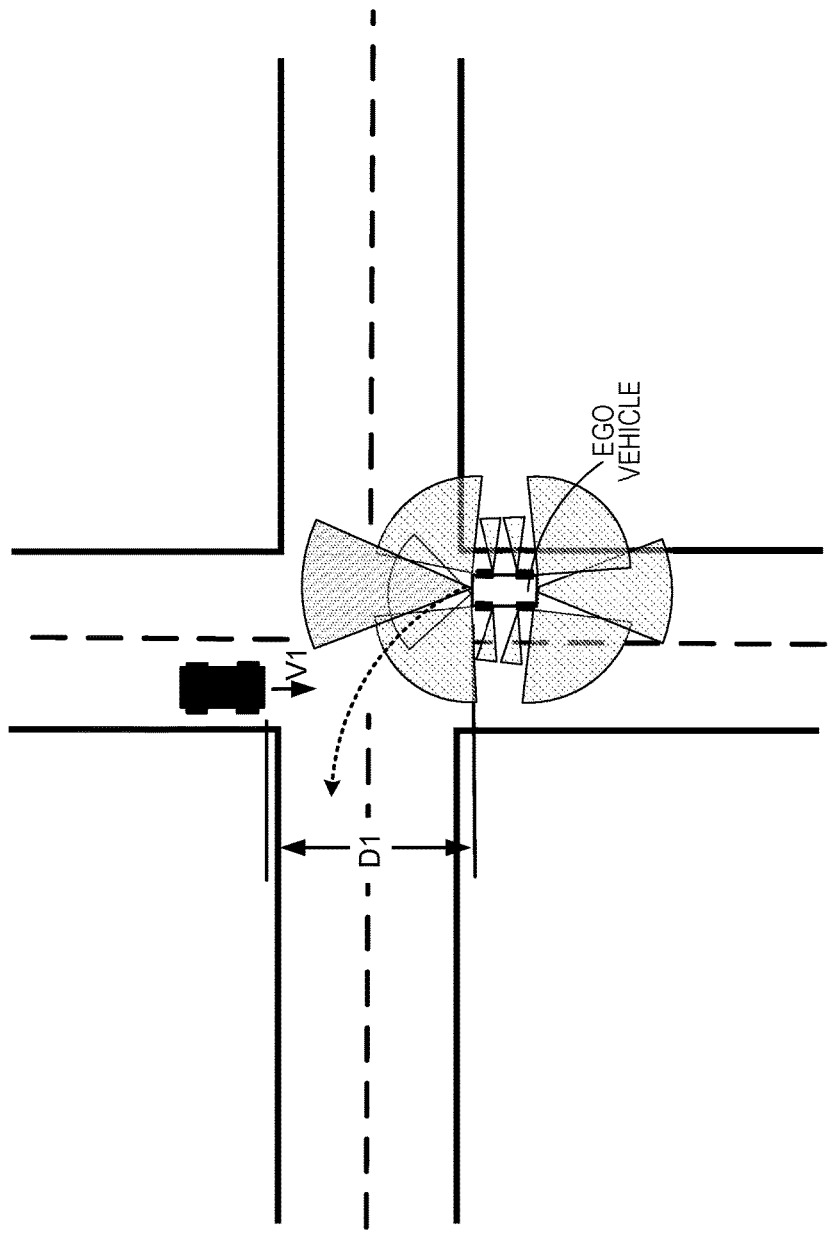

Spatial Characteristics of Intersections, Roundabouts, Junctions, or Other Road Features As illustrated by the example shown in FIG. 5, road network information may contain, or allow calculation by a separate process, information pertaining to the spatial characteristics of road intersections, roundabouts, junctions, or other roadway features including multi-lane surface roads and highways. Such information may include the width of a roadway, the distance across an intersection (i.e., the distance from a point on a travel lane at the edge of an intersection to a point on an opposing lane at an opposite edge of an intersection), and the distance across a roundabout (i.e. the diameter of a roundabout), for example.

Analysis of such spatial characteristics, in light of knowledge of the detection properties of the autonomous vehicle's sensor system, may allow a determination that certain road segments cannot be navigated by the autonomous vehicle at a specified level of safety or robustness without regard to or in light of a certain time or times of day or range of times (e.g., after sunset and before sunrise). This may allow the autonomous vehicle to avoid (for example) certain intersections that are, for example, "too large to see across after sunset," given practical limitations on the autonomous vehicle's sensing capabilities and the allowable travel speed of the roadway. These limitations may make it impossible for the autonomous vehicle sensors to provide data products to the motion planning process with sufficient time to react to oncoming traffic.

Figure 4:
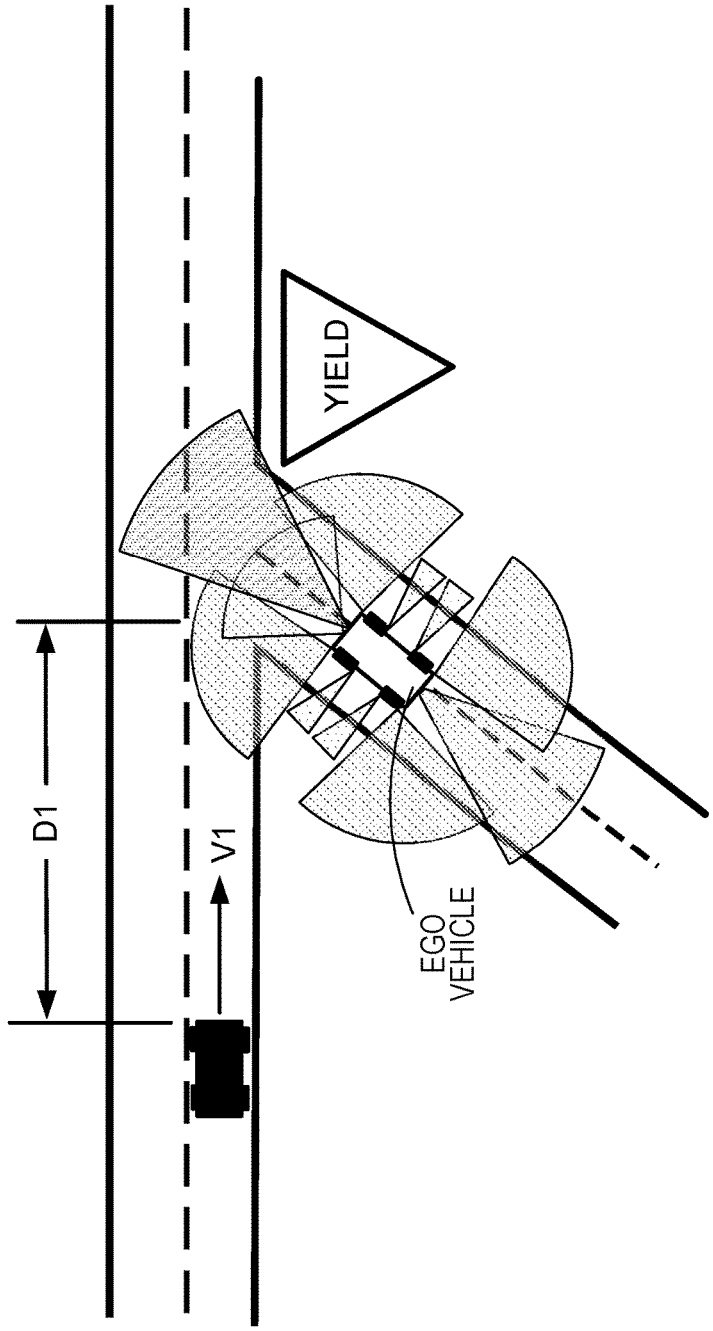

Connectivity Characteristics of Intersections, Roundabouts, Junctions, or Other Road Features As illustrated by the example shown in FIG. 4, road network information may contain, or allow calculating by a separate process, information pertaining to the connectivity characteristics of specific road segments or individual road segment lanes or other road features. Such information may include the orientation of intersecting road segments with respect to one another, for example. It may also include designations of specialized travel lanes such as right turn only and left turn only lane designations, or identifications of highway entrance ramps and exit ramps.

Analysis of such connectivity characteristics, in light of knowledge of the detection properties of the autonomous vehicle's sensor system, the capabilities of the motion planning process, and the capabilities of the decision-making process, may allow determination that certain road segments or junctions cannot be navigated by the autonomous vehicle at a specified level of safety or robustness, potentially at a certain time(s) of day or range of times. This may allow the autonomous vehicle to avoid, for example, intersections with geometric properties that make it impossible for the autonomous vehicle sensors to provide data products to the motion planning process with sufficient time to react to oncoming traffic. It may also allow the autonomous vehicle to avoid, intersections that are too complex to safely navigate (e.g., due to complex required merging, or inability to reason about travel in specialized travel lanes), given known limitations on the vehicle's decision-making capability.

Spatial Orientations of Road Features

Figure 6:
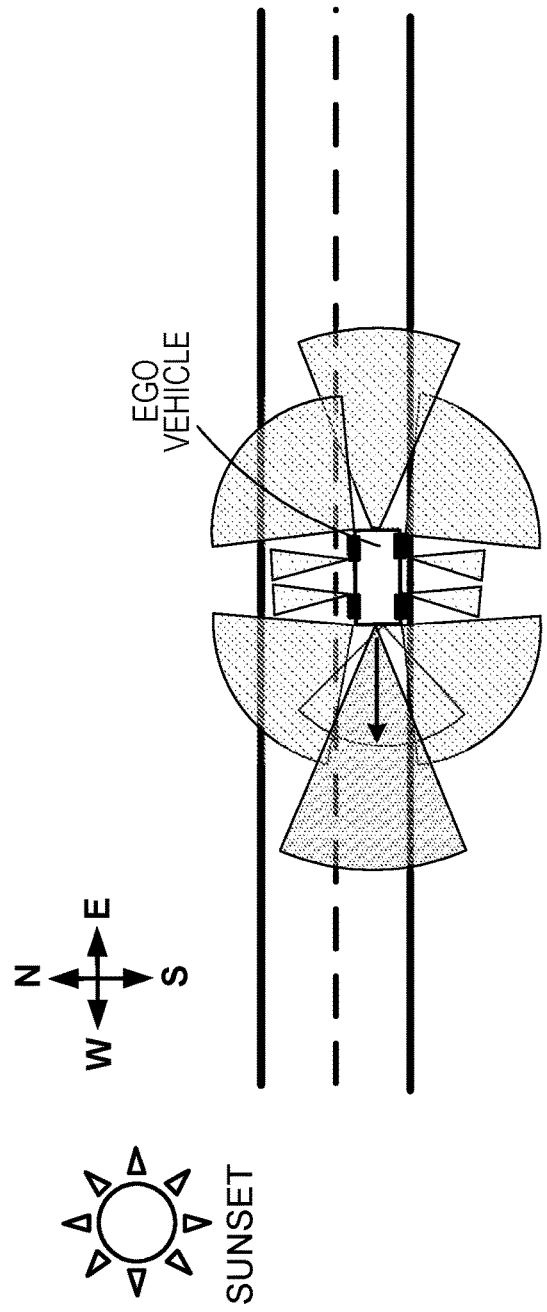

As illustrated by the examples shown in FIG. 6, road network information may contain, or allow calculation by a separate process, information pertaining to the spatial orientation (e.g., the orientation in an inertial coordinate frame) of specific road segments or individual road segment lanes or other road features.

Analysis of orientation of road features, in light of knowledge of the detection properties of the autonomous vehicle's sensor system, may allow determination that certain road segments or junctions cannot be navigated by the autonomous vehicle at a specified level of safety or robustness, potentially at a certain time(s) of day or range of times. This may allow the autonomous vehicle to avoid (for example) being "sun blinded" (i.e., experiencing severely degraded performance of video and/or LIDAR sensors due to exposure to direct sunlight at a low oblique incidence angle).

Locations of Roadworks and Traffic Accidents

Road network information may contain, or be augmented to include via real time mapping service providers or another input, information regarding the location of roadworks or accidents, potentially resulting in closure of certain road segments. Analysis of such information, in light of knowledge of the detection properties of the autonomous vehicle's sensor system, may allow determination that certain road segments or junctions cannot be navigated by the autonomous vehicle due to the vehicle's inability to detect ad hoc signage, barriers, or hand signals presented by human traffic guides associated with the roadworks or accident.

Locations of Rough Road Features

Road network information may contain, or be augmented to include via real time mapping service providers or similar inputs, information regarding the locations of regions of rough, degraded, potholed, damaged, washboarded, or partially constructed roads, including unprepared roads and secondary roads, and roads deliberately constructed with speed bumps or rumble strips. This information may be in the form of a binary designation (e.g., "ROUGH ROAD" or "SMOOTH ROAD") or in the form of a continuous numerical or semantic metric that quantifies road surface roughness.

Analysis of road surface roughness, in light of knowledge of the detection properties of the autonomous vehicle's sensor system, may allow determination that certain road segments or junctions cannot be navigated by the autonomous vehicle at a specified level of safety or robustness, potentially at a certain time(s) of day or range of times. This may allow the autonomous vehicle to avoid (for example) severely washboarded roads that incite vibration in the physical sensor mounts, leading to poor sensor system performance, or road regions with speed bumps that might be accidentally classified as impassable obstacles by a perception process.

Locations of Road Features Having Poor Visibility Due to Curvature and Slope

Figure 7:
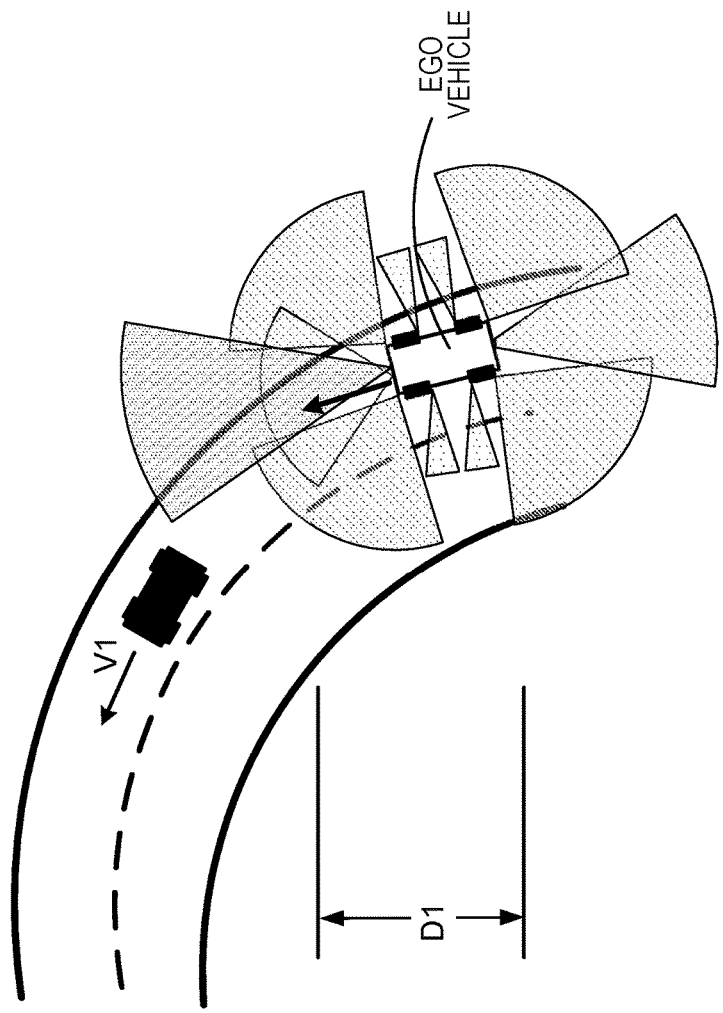
Figure 8:
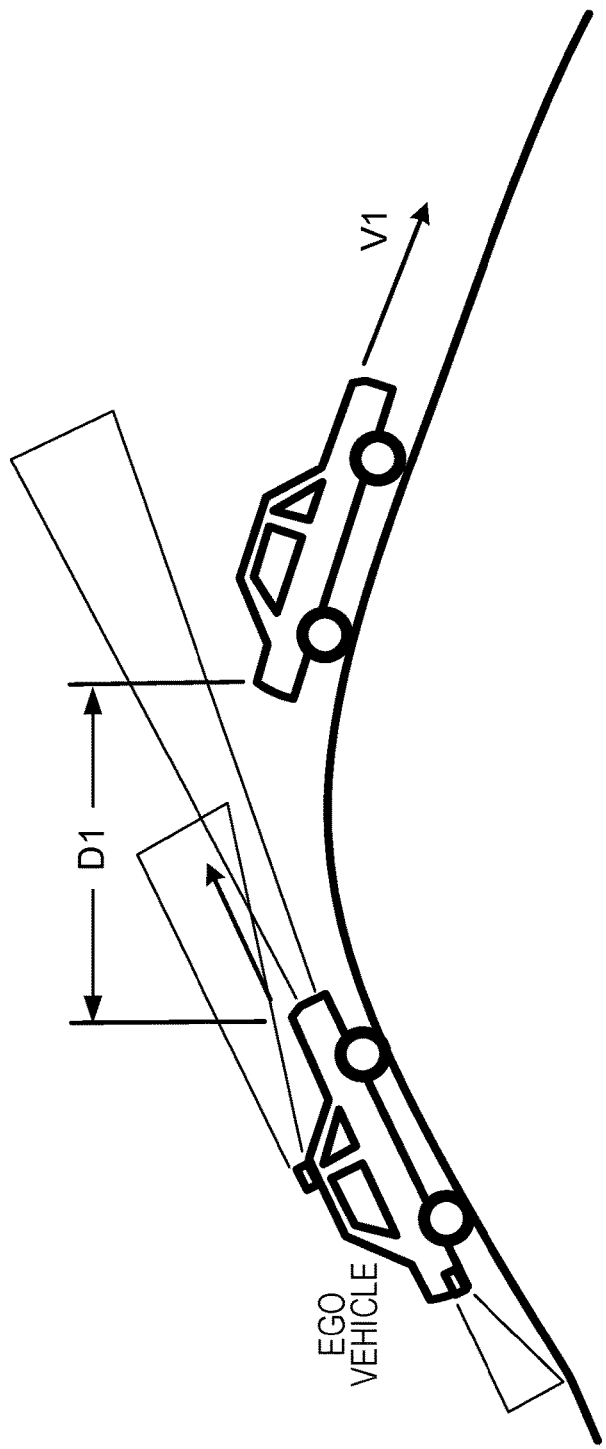

As shown in FIGS. 7 and 8, road network information may contain, or allow calculation by a separate process of information pertaining to the curvature and slope (along the vehicle pitch or roll axis) of the road feature.

Analysis of curvature and slope of road features, in light of knowledge of the detection properties of the autonomous vehicle's sensor system, may allow determination that certain road segments or junctions cannot be navigated by the autonomous vehicle at a specified level of safety or robustness, potentially at a certain time(s) of day or range of times. This may allow the autonomous vehicle to avoid road segments that are steeply pitched and therefore make it impossible for the vehicle sensor system to "see over the hill," (i.e., detect the presence of traffic in the surrounding environment due to the limited vertical field of view of the sensors), and to "see around the corner," (i.e., detect the presence of traffic in the surrounding environment due to the limited horizontal field of view of the sensors).

Locations of Road Features Having Illegible, Eroded, Incomprehensible, Poorly Maintained or Positioned Markings, Signage, or Signals Road network information may contain, or be augmented to include via real time mapping service providers or another input, information regarding the locations of road regions with illegible, eroded, incomprehensible, or poorly maintained or positioned lane markings and other road markings, signage, or signals Analysis of such information, in light of knowledge of the detection properties of the autonomous vehicle's sensor system and (potentially) the capabilities of the motion planning or decision-making process, may allow determination that certain road segments or junctions cannot be navigated by the autonomous vehicle at a specified level of safety or robustness, potentially at a certain time(s) of day or range of times. This may allow the autonomous vehicle to avoid (for example) poorly marked road regions to take account of the vehicle's inability to safely navigate within the lanes, intersections with traffic signs or signals that are partially occluded (e.g. by foliage) or otherwise difficult to detect from a nominal travel lane(s). It may also allow the autonomous vehicle to avoid (for example) road regions with signals or signage that are region- or country-specific and cannot be reliably detected by the vehicle perception process(es).

Locations of Road Features Having Poor Prior Driving Performance by the Autonomous Vehicle or Another Autonomous Vehicle Road network information may contain, or be augmented to include via real time mapping service providers or another input, or by the autonomous vehicle of interest or any other vehicle in a fleet of autonomous vehicles, information regarding the locations of road features where the autonomous vehicle of interest, or another autonomous vehicle, has experienced dangerous, degraded, unsafe, or otherwise undesirable driving performance, potentially due to high scenario traffic or pedestrian density, occlusion from static objects, traffic junction complexity, or other factors. Identification of regions of poor vehicle performance can be "tagged" in a map database, and marked for avoidance when the number of tagged incidents exceeds a specified threshold. This may allow the autonomous vehicle to avoid road features where the vehicle or other vehicles have experienced navigation difficulty.

Locations of Road Features Having Poor Prior Simulation Performance by a Modeled Autonomous Vehicle Road network information may contain, or be augmented to include, information regarding the locations of road regions where a model of the autonomous vehicle of interest has been observed in a simulated environment to experience dangerous, degraded, unsafe, or otherwise undesirable driving performance, potentially due to scenario traffic or pedestrian density, occlusion from static objects, traffic junction complexity, or other factors. Identification of regions of poor vehicle performance can be "tagged" in a map database, and marked for avoidance. This may allow the autonomous vehicle to avoid road regions where a model of the vehicle has experienced difficulty in safely navigating in a simulation environment, thereby suggesting that the experimental vehicle may face navigation challenges in the real world environment.

Locations of Road Features that May Present Physical Navigation Challenges in Inclement Weather Road network information may contain, or allow calculation by a separate process, or be augmented to include via real time mapping service providers or another input, information pertaining to the locations of road features that may present navigation challenges in inclement weather or under specified environmental conditions.

Analysis of such information, in light of knowledge of the detection properties of the autonomous vehicle's sensor system, and knowledge of the performance characteristics of the vehicle's motion control process, may allow determination that certain road segments or junctions cannot be navigated by the autonomous vehicle at a specified level of safety or robustness, potentially at a certain time(s) of day or range of times. This may allow the autonomous vehicle to avoid (for example) road segments containing road inclination or curvature that are impossible to safely navigate when covered with ice, snow, or freezing rain.

Locations of Road Features that May Lead to Known Vehicle Fault or Failure Conditions Road network information may contain, or allow calculation by a separate process, or be augmented to include via real time mapping service providers or another input, information pertaining to the locations of road features that may lead to known vehicle fault or failure conditions in various sensors or software processes.

Analysis of such information, in light of knowledge of the detection properties of the autonomous vehicle's sensor system, and knowledge of the performance characteristics of the vehicle's motion control process, may allow determination that certain road segments or junctions cannot be navigated by the autonomous vehicle at a specified level of safety or robustness, potentially at a certain time(s) of day or range of times. This may allow the autonomous vehicle to avoid (for example) specific types of metal bridges or overpasses that may induce false readings from RADAR sensors, certain tunnels that may block GPS signals and therefore lead to poor vehicle localization performance, and certain extremely flat roadway regions that may not provide vertical features that are detectable by LIDAR sensors and may therefore lead to poor vehicle localization performance.

Road Segments Containing Road Inclination or Curvature that are Impossible to Safely Navigate when Covered with Ice, Snow, or Freezing Rain.

Road network information may contain, or allow calculation by a separate process, or be augmented to include from real time mapping service providers or another source, information pertaining to the locations of road features that may present navigation challenges in inclement weather or under specified environmental conditions.

Analysis of such information, in light of knowledge of the detection properties of the autonomous vehicle's sensor system, and knowledge of the performance characteristics of the vehicle's motion control process, may allow determination that certain road segments or junctions cannot be navigated by the autonomous vehicle at a specified level of safety or robustness, potentially at a certain time(s) of day or range of times. This may allow the autonomous vehicle to avoid (for example) road segments containing road inclination or curvature that are impossible to safely navigate when covered with ice or freezing rain.

In addition to identifying specific road segments that are not able to be safely navigated by an autonomous vehicle, it is possible to do the opposite: to identify specific road segments that are able to be safely navigated by an autonomous vehicle, based on analysis of relevant information sources as described above. For example, based on analysis of known performance characteristics of vehicle sensors and software processes, and given information about road features, it is possible to determine if a given road segment can be safely and robustly navigated by the autonomous vehicle.

Such analysis would be useful for compiling a map data product or a feed of data to be used by other products or processes, describing "validated autonomous driving routes" of the autonomous vehicle. In some implementations, a data product or data feed could describe "unsafe autonomous driving routes". This data could be used as one of the properties of road segments that are maintained as part of road network information. In some cases, the validation of road segments and routes (or determination of inability to travel safely or robustly) could be based on successful experimental travel (or simulated travel) by an autonomous vehicle at a level of road features such as streets or at a lane level within a given road feature. A routing algorithm could make use of such information by considering only validated autonomous driving routes when determining an optimal route between the ego vehicle's current position and a goal position. Such an optimal route might attempt to include only road segments that have been deemed "validated autonomous driving routes," or it might attempt to include a combination of validated and unvalidated driving routes, with the combination determined by an optimization process that considers a variety of factors such as travel distance, expected travel time, and whether or not the road segments are validated or unvalidated, among other factors. In general the route algorithm could explore only candidate routes that are known to have a viability status that exceeds a viability threshold, for example, to allow for sufficiently robust or sufficiently safe travel or both.

In some instances, such information could be used for urban planning purposes, to enable users (i.e., human planners of road networks or automated road network planning software processes) to avoid designing road segments or intersections that are likely to pose navigation challenges to autonomous vehicles. In such a use case, the analysis methods described here would be employed in the context of road design software tools or processes.

Such a road design software tool or process would allow a user to specify or design a road segment, road network, intersection, highway, or other road feature using a variety of possible input devices and user interfaces. As the user employs the road design software tool to specify or design a road segment, road network, intersection, highway, or other road feature, a software process (i.e., a "viability status process") would analyze the viability status of a road segment or region of multiple, potentially connected, road segments (e.g., a freeway, or intersection). The viability status process may also analyze the viability status of a route. The viability status is determined based on the analysis methods described above.

The output of the viability status process can be a viability status assessment, i.e., an assessment of the viability of the road segment, road network, intersection, highway, or other road feature, or route, expressed in binary designation (e.g., "VIABLE" or "NOT VIABLE") or can take the form of a continuous numerical or semantic metric that quantifies viability. The viability status assessment may include independent assessments of the safety or robustness of the road segment, road network, intersection, highway, or other road feature, or route, each expressed in binary designation or in the form of a continuous numerical or semantic metrics that quantifies safety or robustness. The output of the viability status process may include a warning to the user based on the value of the viability status assessment.

Depending on the value of the viability status assessment, the road segment, road network, intersection, highway, or other road feature designed by the user may be automatically deleted. Depending on the value of the viability status assessment, the road segment, road network, intersection, highway, or other road feature may be automatically modified in such a manner as to improve the viability status assessment.

In this manner a road design tool or process may be able to alert a user when the user has designed a hazardous road segments, intersection, or route and thereby deter construction of such road segment, intersection, or route, and potentially also suggest improved designs of the road segment, intersection, or route.

We sometimes use the phrase "viability status" broadly to include, for example, any determination or indication for a route or road feature or segment of a route of the level of suitability for travel by an autonomous vehicle, for example, whether it is unsafe, the degree to which it is unsafe, whether it is safe, the degree to which it is safe, whether it can be traveled robustly or not, and the degree of robustness, whether it is valid or not, and other similar interpretations.

Other implementations are also within the scope of the following claims.

The invention claimed is:

1. A computer-implemented method comprising by computer determining an ability of an autonomous vehicle to travel a first road feature or a first road segment or a first route that is being considered for the autonomous vehicle as of a time or range of times, the first road feature, the first road segment or the first route conforming to properties of stored road network information and,
eliminating the first road feature or the first road segment or the first route from consideration for the vehicle to travel based on the computer determining the ability of the autonomous vehicle to travel the first road feature or the first road segment or the first route,
the determination by the computer being based on analysis of performance of the autonomous vehicle, the analysis of performance of the autonomous vehicle comprising analyzing performance of a perception process of the autonomous vehicle, and
based on the determination by the computer, sending signals to cause the autonomous vehicle to travel a second road feature or a second road segment or a second route, wherein the second road feature or the second road segment or the second route is different than the first road feature or the first road segment or the first route.

2. The method of claim 1 in which the analysis of performance of the autonomous vehicle comprises prior driving performance associated with road features.

3. The method of claim 1 in which the analysis of performance of the autonomous vehicle comprises prior simulation performance associated with road features.

4. The method of claim 1, in which the analysis of performance of the autonomous vehicle comprises analyzing dangerous driving performance.

5. The method of claim 1, in which the analysis of performance of the autonomous vehicle comprises analyzing degraded driving performance.

6. The method of claim 1, in which the analysis of performance of the autonomous vehicle comprises analyzing a traffic junction complexity.

7. The method of claim 1, in which the analysis of performance of the autonomous vehicle comprises analyzing a traffic density.

8. The method of claim 1, in which the analysis of performance of the autonomous vehicle comprises analyzing a pedestrian density.

9. The method of claim 1, in which the analysis of performance of the autonomous vehicle comprises analyzing inclement weather.

10. The method of claim 1, in which the analysis of performance of the autonomous vehicle comprises analyzing a slippery road surface.

11. The method of claim 1, in which the analysis of performance of the autonomous vehicle comprises analyzing road features or road segments or routes associated with a failure of the autonomous vehicle.

12. The method of claim 1, in which the analysis of performance of the autonomous vehicle comprises analyzing road features or road segments or routes associated with a false reading of a vehicle sensor.

13. The method of claim 1, in which the analysis of performance of the autonomous vehicle comprises analyzing road features or road segments or routes associated with degraded performance of a vehicle sensor.

14. The method of claim 1, in which the analysis of performance of the autonomous vehicle comprises analyzing road features or road segments associated with a failure of a vehicle sensor.

15. The method of claim 1, in which the analysis of performance of the autonomous vehicle comprises analyzing road features or road segments blocking signal perception of a vehicle sensor.

16. The method of claim 1, in which the analysis of performance of the autonomous vehicle comprises identifying data products that a vehicle sensor cannot generate.

17. The method of claim 1, comprising tagging in a map database the performance of the autonomous vehicle.

18. The method of claim 1, comprising storing information in a map database for avoidance of a road feature or a road segment or a route.

19. The method of claim 18, in which the information stored in the map database for avoidance is based on a measure of poor performance of the autonomous vehicle on the road feature or the road segment or the route, beyond a threshold.

20. The method of claim 1, in which the ability of the autonomous vehicle to travel the road feature or road segment or route comprises the ability of the autonomous vehicle to travel the road feature or road segment or route safely or robustly.

21. The method of claim 1, in which the performance of the perception process comprises reliable detection of signals or signage.

22. The method of claim 1, in which the performance of the perception process comprises occlusion.

23. The method of claim 22, in which the occlusion comprises occlusion from static objects.

24. The method of claim 22, in which the occlusion comprises occlusion from traffic junction complexity.

25. The method of claim 1, in which the performance of the perception process comprises performance of a sensor system.

26. The method of claim 1, in which the performance of the perception process comprises a limited vertical field of view.

27. The method of claim 1, in which the performance of the perception process comprises a limited horizontal field of view.

28. The method of claim 1, in which the performance of the perception process comprises properties of a sensor system.

29. The method of claim 1, in which the performance of the perception process comprises a fault or failure condition.

30. The method of claim 1, in which the performance of the perception process comprises a false sensor reading.

* * * * *